(12) United States Patent
Fortney

(10) Patent No.: US 11,550,015 B2
(45) Date of Patent: Jan. 10, 2023

(54) RANGING SYSTEMS AND METHODS FOR DECREASING TRANSITIVE EFFECTS IN MULTI-RANGE MATERIALS MEASUREMENTS

(71) Applicant: Lake Shore Cryotronics, Inc., Westerville, OH (US)

(72) Inventor: Houston Fortney, Columbus, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 0 days.

(21) Appl. No.: 17/241,450

(22) Filed: Apr. 27, 2021

(65) Prior Publication Data

US 2021/0336629 A1 Oct. 28, 2021

Related U.S. Application Data

(60) Provisional application No. 63/057,745, filed on Jul. 28, 2020, provisional application No. 63/034,052, (Continued)

(51) Int. Cl.
*H03M 1/62* (2006.01)
*G01R 35/00* (2006.01)
(Continued)

(52) U.S. Cl.
CPC .......... *G01R 35/005* (2013.01); *G01R 19/25* (2013.01); *G01R 31/2841* (2013.01); (Continued)

(58) Field of Classification Search
CPC .. G01R 35/005; H03M 1/0845; H03M 1/121; H03M 1/188
(Continued)

(56) References Cited

U.S. PATENT DOCUMENTS 3,293,556 A 12/1966 Kotzebue et al.
3,424,981 A 1/1969 Erdman
(Continued)

FOREIGN PATENT DOCUMENTS

EP 119711 A1 9/1984
EP 559657 B1 10/1994
(Continued)

OTHER PUBLICATIONS

Edn, "The ABCs of interleaved ADCs," https://www.edn.com/the-abcs-of-interleaved-adcs/, Feb. 17, 2013, 8 pages.
(Continued)

*Primary Examiner* — Peguy Jean Pierre
(74) *Attorney, Agent, or Firm* — Calfee, Halter & Griswold LLP

(57) ABSTRACT

A measurement system includes a gain chain configured to amplify an analog input signal; a range selector configured to select a gain between the analog input signal and a plurality of analog-to-digital converter (ADC) outputs from a plurality of ADCs, wherein each ADC output has a path, and a gain of each output path is made up of a plurality of gain stages in the gain chain; and a mixer configured to combine the plurality of ADC outputs into a single mixed output.

22 Claims, 25 Drawing Sheets

Related U.S. Application Data filed on Jun. 3, 2020, provisional application No. 63/016,747, filed on Apr. 28, 2020.

(51) Int. Cl.
| | | |
|---|---|---|
| *G01R 19/25* | (2006.01) | |
| *G01R 31/28* | (2006.01) | |
| *H03M 1/08* | (2006.01) | |
| *H03M 1/12* | (2006.01) | |
| *H03M 1/18* | (2006.01) | |

(52) U.S. Cl.
CPC ......... *H03M 1/0845* (2013.01); *H03M 1/121* (2013.01); *H03M 1/188* (2013.01)

(58) Field of Classification Search
USPC ..................... 341/155, 141, 118, 120, 139
See application file for complete search history.

(56) References Cited

U.S. PATENT DOCUMENTS

| | | | |
|---|---|---|---|
| 3,467,958 | A | 9/1969 | Mckinney |
| 3,509,558 | A | 4/1970 | Cancro |
| 3,626,252 | A | 12/1971 | Cath |
| 3,654,560 | A | 4/1972 | Cath et al. |
| 3,757,216 | A | 9/1973 | Kurtin et al. |
| 3,757,241 | A | 9/1973 | Kime et al. |
| 3,820,112 | A | 6/1974 | Roth |
| 3,855,589 | A | 12/1974 | Solender |
| 3,875,506 | A | 4/1975 | Cath |
| 3,979,642 | A | 9/1976 | Cath et al. |
| 4,069,479 | A | 1/1978 | Carpenter et al. |
| 4,129,864 | A | 12/1978 | Carpenter et al. |
| 4,383,247 | A | 5/1983 | Assard |
| 4,449,120 | A | 5/1984 | Rialan et al. |
| 4,542,346 | A | 9/1985 | Mcneilly |
| 4,544,917 | A | 10/1985 | Lenhoff, Jr. |
| 4,598,253 | A | 7/1986 | Reindel et al. |
| 4,652,882 | A | 3/1987 | Shovlin et al. |
| 4,674,062 | A | 6/1987 | Premerlani |
| 4,733,217 | A | 3/1988 | Dingwall |
| 4,807,146 | A | 2/1989 | Goodrich et al. |
| 4,823,129 | A | 4/1989 | Nelson |
| 4,847,523 | A | 7/1989 | Schneider |
| 4,868,571 | A | 9/1989 | Inamasu |
| 4,914,677 | A | 4/1990 | Yamaguchi et al. |
| 4,999,628 | A | 3/1991 | Kakubo et al. |
| 5,015,963 | A | 5/1991 | Sutton |
| 5,023,552 | A | 6/1991 | Mehlkopf et al. |
| 5,039,934 | A | 8/1991 | Banaska |
| 5,111,202 | A | 5/1992 | Rivera et al. |
| 5,144,154 | A | 9/1992 | Banaska |
| 5,210,484 | A | 5/1993 | Remillard et al. |
| 5,250,948 | A | 10/1993 | Berstein et al. |
| 5,353,027 | A | 10/1994 | Vorenkamp et al. |
| 5,386,188 | A | 1/1995 | Minneman et al. |
| 5,414,348 | A | 5/1995 | Niemann |
| 5,422,643 | A | 6/1995 | Chu et al. |
| 5,490,325 | A | 2/1996 | Niemann et al. |
| 5,491,548 | A | 2/1996 | Bell et al. |
| 5,684,480 | A | 11/1997 | Jansson |
| 5,777,569 | A | 7/1998 | Naruki et al. |
| 5,886,530 | A | 3/1999 | Fasnacht et al. |
| 5,999,002 | A | 12/1999 | Fasnacht et al. |
| 6,031,478 | A | 2/2000 | Oberhammer et al. |
| 6,069,484 | A | 5/2000 | Sobolewski et al. |
| 6,100,832 | A | 8/2000 | Uesugi |
| 6,104,329 | A | 8/2000 | Kawano |
| 6,271,780 | B1 | 8/2001 | Gong et al. |
| 6,317,065 | B1 | 11/2001 | Raleigh et al. |
| 6,333,707 | B1 | 12/2001 | Oberhammer et al. |
| 6,445,328 | B2 | 9/2002 | Francis |
| 6,501,255 | B2 | 12/2002 | Pomeroy |
| 6,621,433 | B1 | 9/2003 | Hertz |
| 6,683,552 | B2 | 1/2004 | Noll et al. |
| 6,949,734 | B2 | 9/2005 | Neff et al. |
| 6,977,502 | B1* | 12/2005 | Hertz ................ G01R 33/3621 324/318 |
| 7,123,894 | B2 | 10/2006 | Hessel et al. |
| 7,167,655 | B2 | 1/2007 | Olivier |
| 7,248,199 | B2 | 7/2007 | Asano et al. |
| 7,253,680 | B2 | 8/2007 | Laletin |
| 7,365,664 | B2 | 4/2008 | Caduff et al. |
| 7,590,196 | B2 | 9/2009 | Gibbs |
| 7,676,208 | B2* | 3/2010 | Lee ...................... H04W 52/52 375/345 |
| 7,903,008 | B2 | 3/2011 | Regier |
| 7,923,985 | B2 | 4/2011 | Goeke et al. |
| 8,009,075 | B2 | 8/2011 | Currivan et al. |
| 8,180,309 | B2 | 5/2012 | Kimmig et al. |
| 8,212,697 | B2 | 7/2012 | Jansson et al. |
| 8,507,802 | B1 | 8/2013 | Knauer |
| 8,571,152 | B1 | 10/2013 | Chen et al. |
| 8,797,025 | B2 | 8/2014 | Regier et al. |
| 8,841,964 | B2 | 9/2014 | Hafizovic et al. |
| 8,860,505 | B2 | 10/2014 | Hafizovic et al. |
| 9,244,103 | B1 | 1/2016 | Haviland et al. |
| 9,323,878 | B2 | 4/2016 | Shepherd et al. |
| 9,324,545 | B2 | 4/2016 | Green et al. |
| 9,575,105 | B1 | 2/2017 | Witt et al. |
| 9,645,193 | B2 | 5/2017 | Niemann |
| 9,654,134 | B2 | 5/2017 | Popovich et al. |
| 9,778,666 | B2 | 10/2017 | Sobolewski |
| 10,284,217 | B1 | 5/2019 | Schneider et al. |
| 10,404,215 | B2 | 9/2019 | Motzkau et al. |
| 2004/0162694 | A1 | 8/2004 | Ricca et al. |
| 2005/0218971 | A1 | 10/2005 | Elfman |
| 2007/0182429 | A1 | 8/2007 | Goeke |
| 2008/0221805 | A1 | 9/2008 | Andrews |
| 2009/0273338 | A1 | 11/2009 | Goeke et al. |
| 2010/0103016 | A1 | 4/2010 | Thomas et al. |
| 2011/0074476 | A1 | 3/2011 | Heer et al. |
| 2012/0112949 | A1 | 5/2012 | Morgan |
| 2013/0033947 | A1 | 2/2013 | Passerini et al. |
| 2013/0082854 | A1 | 4/2013 | Keane |
| 2014/0145729 | A1 | 5/2014 | Sobolewski |
| 2014/0354354 | A1 | 12/2014 | Goeke |
| 2015/0280648 | A1 | 10/2015 | Vitali |
| 2016/0344401 | A1 | 11/2016 | La Grou |

FOREIGN PATENT DOCUMENTS

| | | |
|---|---|---|
| EP | 1111795 A2 | 6/2001 |
| EP | 707383 B1 | 5/2002 |
| EP | 821241 B1 | 10/2005 |
| EP | 1655848 B1 | 11/2008 |
| EP | 3035062 A2 | 6/2016 |
| WO | 03009478 A2 | 1/2003 |
| WO | 2009143635 A1 | 12/2009 |

OTHER PUBLICATIONS

Fifield, "Stretching the Dynamic Range of ADCs—a case study," EE Times, Oct. 9, 2012, 4 pages.

Gervasoni et al., "A General Purpose Lock-In Amplifier Enabling Sub-ppm Resolution," 30th Eurosensors Conference, EUROSENSORS 2016, Procedia Engineering 168, 2016, pp. 1651-1654.

Ghosh et al., "Mitigating timing errors in time-interleaved ADCs: a signal conditioning approach," 2013 IEEE International Symposium on Circuits and Systems (ISCAS), 2013, 4 pages.

Kester, "ADC Architectures I: The Flash Converter," Analog Devices, MT-020 Tutorial, 2009, 15 pages.

Kumar et al., "Design and Considerations of ADC0808 as Interleaved ADCs," International Journal of Advanced Scientific and Technical Research, Issue 4, vol. 1, Jan.-Feb. 2014, 11 pages.

Lin et al., "Chapter 3: Parallel-Sampling ADC Architecture for Multi-carrier Signals," Power-Efficient High-Speed Parallel-Sampling ADCs for Broadband Multi-carrier Systems, Analog Circuits and Signal Processing, Springer International Publishing, Switzerland, 2015, 28 pages.

Manganaro et al., "Interleaving ADCs: Unraveling the Mysteries," Analog Dialogue 49-07, Jul. 2015, 5 pages.

(56) References Cited

OTHER PUBLICATIONS

Reeder et al., "Pushing the State of the Art with Multichannel A/D Converters," Analog Dialogue 39-05, May 2005, 4 pages.
Stanford Research Systems, "About Lock-In Amplifiers, Application Note #3," www.thinkSRS.com, 9 pages.
Stutt, "Low-Frequency Spectrum of Lock-in Amplifiers," Research Laboratory of Electronics, Massachusetts Institute of Technology, Technical Report No. 105, Mar. 26, 1949, 22 pages.
Wikipedia, "Lock-in amplifier," https://en.wikipedia.org/wiki/Lock-in_amplifier, downloaded on Jul. 27, 2021, 5 pages.
Zurich Instruments, "Principles of lock-in detection and the state of the art," White Paper, Nov. 2016, 10 pages.
International Search Report and Written Opinion from PCT/US2021/029328 dated Jul. 20, 2021.
International Search Report and Written Opinion from PCT/US2021/029335 dated Aug. 5, 2021.
International Search Report and Written Opinion from PCT/US2021/029332 dated Aug. 12, 2021.

* cited by examiner

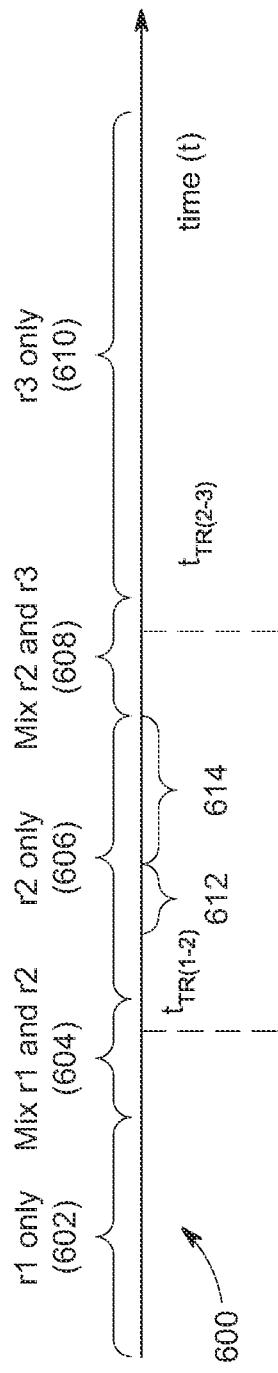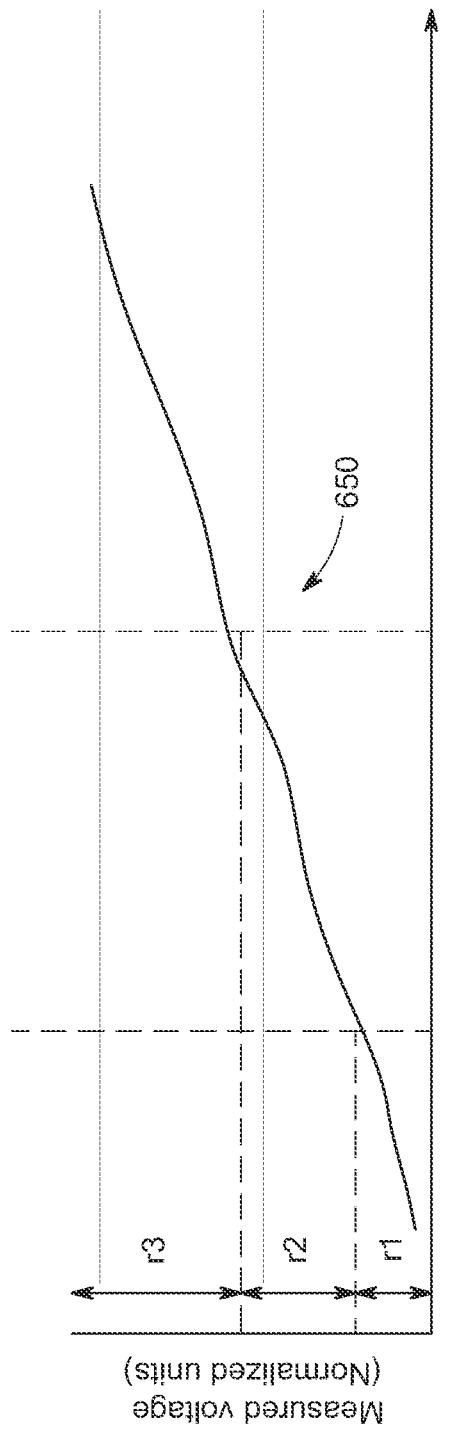
FIG. 6A
FIG. 6B

| Range enumeration | Input voltage | Enable preamp | Enable stage B | Enable stage C |
|---|---|---|---|---|
| 0 | 1.2+ | 0 | 0 | 0 |
| 1 | 1.1-1.2 | Hold previous | 0 | 0 |
| 1 | 1-1.1 | 1 | 0 | 0 |
| 1 | 0.7-1 | 1 | 0 | 0 |
| 1 | 0.12-0.7 | 1 | 0 | 0 |
| 2 | 0.11-0.12 | 1 | Hold previous | 0 |
| 2 | 0.1-0.11 | 1 | 1 | 0 |
| 2 | 0.07-0.1 | 1 | 1 | 0 |
| 2 | 0.012-0.07 | 1 | 1 | 0 |
| 3 | 0.011-0.012 | 1 | 1 | Hold previous |
| 3 | 0.01-0.011 | 1 | 1 | 1 |
| 3 | 0.007-0.01 | 1 | 1 | 1 |
| 3 | 0.0012-0.007 | 1 | 1 | 1 |
| 4 | 0.0011-0.0012 | 1 | 1 | 1 |
| 4 | 0.001-0.0011 | 1 | 1 | 1 |
| 4 | 0.0007-0.001 | 1 | 1 | 1 |
| 4 | <0.0007 | 1 | 1 | 1 |

FIG. 14

| Range | Channel A gain | Channel B gain | Mixing | Description |
|---|---|---|---|---|
| 10V | 1 | - | All A | Out of ranges |
| 1V | 1 | Hold previous | All A | Hysteresis |
| 1V | 1 | 10 | All A | Anticipate signal will decrease |
| 1V | 1 | 10 | Active | Interpolating |
| 1V | 1 | 10 | All B | Anticipate signal will increase |
| 100mV | Hold previous | 10 | All B | Hysteresis |
| 100mV | 100 | 10 | All B | Anticipate signal will decrease |
| 100mV | 100 | 10 | Active | Interpolating |
| 10mV | 100 | Hold previous | All A | Anticipate signal will increase |
| 10mV | 100 | 10000 | All A | Hysteresis |
| 10mV | 100 | 10000 | Active | Anticipate signal will decrease |
| 10mV | 100 | 10000 | All B | Interpolating |
| 1mV | Hold previous | 10000 | All B | Anticipate signal will increase |
| 1mV | 10000 | 10000 | All B | Hysteresis |
| 1mV | 10000 | 10000 | Active | Interpolating |
| 1mV | 10000 | 10000 | All A | Out of ranges |

FIG. 14 (Cont.)

RANGING SYSTEMS AND METHODS FOR DECREASING TRANSITIVE EFFECTS IN MULTI-RANGE MATERIALS MEASUREMENTS

CROSS-REFERENCE TO RELATED APPLICATIONS

This application claims priority to U.S. Provisional Patent Application No. 63/016,747, to Fortney, "ADVANCED ANALOG-TO-DIGITAL CONVERSION SYSTEMS AND METHODS," filed Apr. 28, 2020; and U.S. Provisional Patent Application No. 63/034,052, to Fortney, "ADVANCED DIGITAL-TO-ANALOG SIGNAL GENERATION SYSTEMS AND METHODS," filed Jun. 3, 2020; and U.S. Provisional Patent Application No. 63/057,745, to Fortney, "SYNCHRONOUS SOURCE MEASURE SYSTEMS AND METHODS," filed Jul. 28, 2020, each of which is incorporated herein by reference in its entirety.

This application is related to the following applications being filed concurrently herewith, each of which is incorporated herein by reference in its entirety: U.S. patent application Ser. No. 17/241,458, to Fortney, "HYBRID DIGITAL AND ANALOG SIGNAL GENERATION SYSTEMS AND METHODS," filed Apr. 27, 2021; and U.S. patent application Ser. No. 17/241,472, to Fortney, "INTEGRATED MEASUREMENT SYSTEMS AND METHODS FOR SYNCHRONOUS, ACCURATE MATERIALS PROPERTY MEASUREMENT," filed Apr. 27, 2021.

FIELD

This disclosure relates to measurement systems and methods. More specifically, it relates to avoiding glitches or errors caused by changes in the ranging of electronics used in the measurements. More generally, it relates to electronics, analytical instrumentation, software, and infrastructure for signal sourcing and signal measuring. The disclosure also relates to systems that measure signals for materials and device characterization and other applications under challenging experimental conditions that can cause high levels of noise and interference.

BACKGROUND

Materials and device property measurements (e.g., electron transport properties such as Hall, mobility and carrier concentration, etc.) often require continuous measuring over decades or orders of magnitude changes in the property. Capturing this requires switching from one set of analytical electronics to another, the different electronics being configured for the different ranges (e.g., decades or orders of magnitude) in the measured property. This switching causes glitches and/or gaps in the measured signal. It also disturbs the data collection process in other ways, such as by causing transients that might compromise the measurement.

Analog-to-digital converters (ADCs) play a key role in the electronics doing the amplifying, filtering, sampling, and digitizing of measured signals in these measurement systems. Therefore, ADC signal processing must be carefully configured for operational conditions, including the range of the measured property. Yet carefully configuring an ADC system for one range likely renders it unsuitable for others. This can lead to error, particularly when properties vary across ranges. Selective amplification can address these errors. Amplifiers, however, introduce their own errors. Those errors derive from amplifier noise, offsets, gain errors, and phase mismatches. In addition, carefully configuring gain over several ranges requires flexibility most amplification systems lack. Small signals need large gain to increase the resolution and noise performance. When the signals become larger over the course of the measurement, that same large gain can cause ADCs to saturate. This can cause distortion and signal loss.

To increase flexibility in configuring gain, amplifier stages can be switched on and off, or in and out of the signal chain. At any given time, the amplifiers switched on are those configured for the current signal range. When the signal enters another range, the system switches to another amplifier chain configured for the new range. However, glitching and discontinuity in the measurement often manifest during the transition.

FIG. 1 shows that effect in a conventionally ranged measurement. Specifically, FIG. 1 shows conventional ranging data 104 over a discontinuity D that results when the measured signal increases through a transition $t_{TR}$ from lower range r1 to higher range r2. FIG. 2 shows an example of a conventional ranging setup 120 that can cause the discontinuity D shown in FIG. 1. Conventional ranging setup 120 includes two gain chains A and B. Gain chain A is dedicated to, and configured for, lower range r1 (FIG. 1). Specifically, both the gain of amplifier $G_A$ and the ADC A are configured for lower range r1. Gain chain B is dedicated to, and configured for, higher range r2 (FIG. 2). This means that the gain of amplifier $G_B$ and ADC B are configured for r2.

When the measured signal is small (i.e., in lower range r1), the channel selection component 122 of ranging setup 120 selects gain chain A. As the measured signal increases toward higher range r2, and transitions between ranges at $t_{TR}$, channel selection component 122 engages electronics gain chain B. In this way, channel selection component 122 attempts to ensure that the measurement system has configured gain over the two different ranges. As shown schematically in FIG. 1, however, the transition $t_{TR}$ can introduce the discontinuity D in the measured data. This is because switching between gain chains A and B may introduce transient signals, noise, or glitches resulting from "warming up" or initiating use of the equipment dedicated to measuring over the transitioned-to range.

Discontinuity D results in two types of ranging error. These errors occur when two ranges (e.g., r1 and r2) have different configured amplifier profiles (A and B, respectively). In the first type of error, the amplifier profile mismatch causes unwanted amplitude discontinuities or jogs ($\Delta V$) in measured output voltage. In the second type, temporal data discontinuity, data flow can be cut off during a range to range transition. In FIG. 1, this manifests in the data gap in the time period from $t_{TR}$ to $t_B$. Temporal data discontinuity happens when changing ranges involves "warming up" or engaging new electronics, specifically the amplifiers associated with profile B. Collecting data is inaccurate or impossible until these transients dissipate. Transients from the cooling down or shutting off of amplifiers associated with amplifier profile A may also cause delays or glitches in the measurement system.

Configuring setups like 120 to eliminate discontinuity D is difficult or impossible. The configuration is limited by the simplicity and lack of variability of the components ($G_A$, ADC A, $G_B$, and ADC B). Therefore, there is a critical need for new and improved solutions for providing robust, high quality, low noise source or measurement signals even as measured signals vary over decades or orders of magnitude. There is a critical need for flexible solutions to provide smoother transitions between ranges that diminish or eliminate such discontinuities as shown in FIG. 1.

SUMMARY

Aspects of the instant disclosure include a measurement system comprising a gain chain configured to amplify an analog input signal, a range selector configured to select a gain between the analog input signal and a plurality of analog-to-digital converter (ADC) outputs from a plurality of ADCs, wherein each ADC output has a path, and a gain of each output path may be made up of a plurality of gain stages in the gain chain, and a mixer configured to combine the plurality of ADC outputs into a single mixed output.

The plurality of ADCs may comprise a first ADC and a second ADC. The combining the plurality of ADC outputs may be performed in accordance to: mixed output=$\alpha E_{first}$+$(1-\alpha)E_{second}$, where: $E_{first}$ may be the output of the first ADC, $E_{second}$ may be the output of the second ADC, and $\alpha$ may be a mixing parameter that varies from one to zero. The system may comprise two or more ADCs. A first portion of the gain chain may be connected to a first one of the plurality of ADCs and a second portion of the gain chain may be connected to a second one of the plurality of ADCs. The range selector may select a gain for the first one of the plurality of ADCs from the first portion of the gain chain and may select a gain for the second one of the plurality of ADCs from the second portion of the gain chain. Each of the gain stages in the gain chain may be connected to each of the plurality of ADCs via one or more switch banks. The range selector may select a first portion of the shared gain stages for a first one of the plurality of ADCs and a second portion of the shared gain stages for a second one of the plurality of ADCs by setting switches in the one or more switch banks. The range selector may comprise a first and second multiplexer. The first multiplexer may select the first portion of the shared gain stages. The second multiplexer may select the second portion of the shared gain stages.

Selection of the first portion of the shared gain stages may comprise configuring a gain for the first one of the plurality of ADCs and selection of the second portion of the shared gain stages may comprise configuring a gain for the second one of the plurality of ADCs. The configuring a gain for the first and second one of the plurality of ADCs may comprise configuring the gains according to at least one range of the input signal. The mixer may be configured to, when the input signal may be in a first range, select an output from a first ADC as the single mixed output. The mixer may be configured to, when the input signal may be in a second range, select an output from a second ADC as the single mixed output. The mixer may be configured to, when the input signal may be in between the first and second ranges, select a mix of the outputs from the first and second ADCs as the single mixed output.

The system may maintain the second ADC online during a first transition period when the input signal may be in the first range. The system may maintain the first ADC online during a second period when the input signal may be in the second range. The range selector may be configured to configure a gain for at least one of the first ADC and second ADC based on an anticipated range of the input signal. During a hysteresis period, the system may maintain the first ADC offline. The system may maintain the second ADC online. The system may maintain a gain of the second ADC constant. The hysteresis period may be between the first transition period and the second transition period.

The plurality of ADC output paths may comprise two ADC output paths that can independently be configured into a high range and a low range path. The low range path may have a first gain for converting the analog input signal. The high range path may have a second gain for converting the analog input signal. The second gain may be lower than the first gain. The paths may comprise a mixing device configured to combine an output of the lower range with an output of the higher range. The system may comprise a device configured to vary an amount of gain combined from the low range path and the high range path. The high range path may be connected to a first gain chain and the low range path may be connected to a second gain chain. The system may comprise a selector to select gain stages of the first gain chain for the first gain and to select gain stages of the second gain chain for the second gain. Each of the first and second gains may comprise gain stages in a gain chain common to the low range path and the high range path. A gain of each output path may be substantially the same. The mixer may average the outputs from each path to reduce noise in the single output.

Aspects of the present disclosure may further comprise a method comprising amplifying an analog input signal using a gain chain, selecting a gain between the analog input signal and a plurality of analog-to-digital converter (ADC) outputs from a plurality of ADCs, wherein each ADC output has a path, and a gain of each output path may be made up of gain stages in the gain chain, and combining the plurality of ADC outputs into a single mixed output.

A first portion of the gain chain may be connected to a first one of the plurality of ADCs and a second portion of the gain chain may be connected to a second one of the plurality of ADCs. Each of the gain stages in the gain chain may be connected to each of the plurality of ADCs via one or more switch banks. The method may further comprise configuring two ADC output paths independently into a high range and a low range path. The method may comprise applying a first gain from the low range path to convert the analog input signal. The method may comprise applying a second gain from the high range path to convert the analog input signal, the second gain being lower than the first gain. The method may comprise combining an output of the lower range with an output of the higher range. The method may comprise varying an amount of gain combined from the high range path and the low range path.

BRIEF DESCRIPTION OF DRAWINGS

FIG. 6A provides a schematic example of an auto-ranging algorithm 600 according to aspects of the present disclosure.

FIG. 6B shows the measurement data corresponding to auto-ranging algorithm 600.

FIG. 14 shows an exemplary implementation of range mixing algorithm 1400.

DETAILED DESCRIPTION

The present disclosure introduces systems and methods that can accommodate measurements over a wide dynamic range with relatively little error, noise, or glitching. Here "glitching" refers to unintended irregularities or inconsistencies that can negatively impact a measurement or operation. Variations disclosed herein accomplish this in a number of different ways. One way is to separately and dynamically configure gain chains for separate ranges. Another is to stich separate ranges together by mixing gain profiles for the ranges. Still another is to introduce shared gain stages that can be assigned to the separate ranges dynamically. These and more ways are generally referred to herein as "seamless ranging." They are discussed in more detail below.

Figure 3:
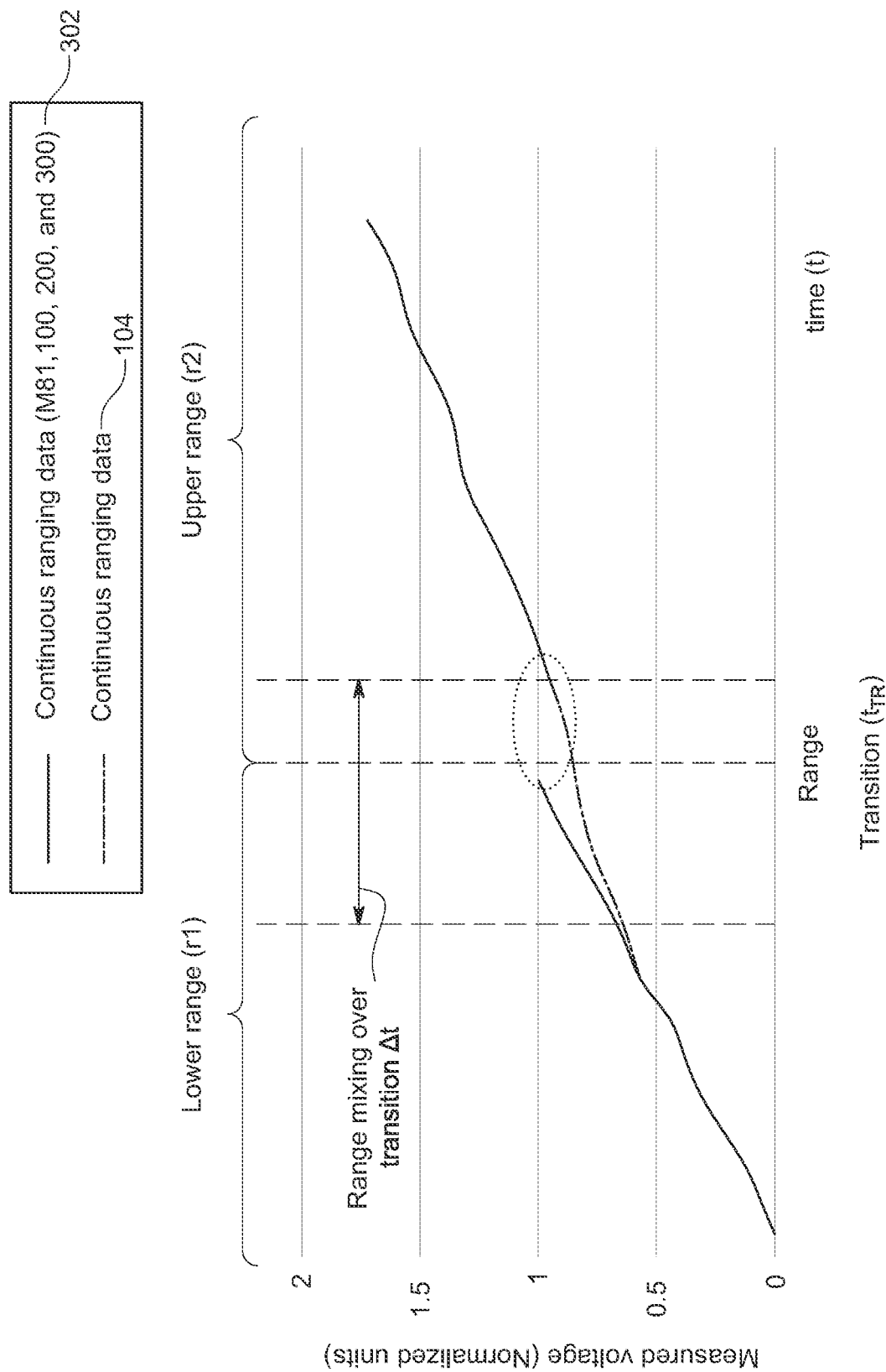
FIG. 3 compares a voltage measurement with seamless (continuous) ranging 302 with the same measurement made by a conventional setup 104 (from FIG. 1) lacking seamless ranging capabilities.

FIG. 3 compares a voltage measurement with seamless ranging 302 according to the present disclosure with the same measurement made by a conventional setup 104 lacking seamless ranging capabilities. FIG. 3 shows discontinuity D in measured data 104 over the range transition Δt. This is because a different set of devices with different measurement profiles (e.g., accuracy, gain, etc.) are used to measure data in ranges r1 and r2. As discussed, switching between ranges r1 and r2 in system 120 may involve transient signals, noise, or glitches resulting from "warming up" or initiating use of the equipment dedicated to measuring over the transitioned-to range (r2).

FIG. 3 also shows how the transition Δt can be smoothed (continuous ranging measured data 302) by the seamless ranging capabilities described herein. This smoothing effect is represented in FIG. 3 as avoidance of discontinuity D by continuous ranging data 302. While only two exemplary ranges, r1 and r2, are discussed in the context of FIG. 3, it is to be understood that the continuous ranging technique may apply to any suitable number of ranges relevant to a particular measurement. For example, the number of ranges may be three, four, or more, in some cases. In each of these cases, continuous ranging can be configured to ensure a smooth transition between each range change regardless of the direction of the range change (i.e., regardless of whether the range change involves an increase, as shown in FIG. 3, or decrease in the measured value (not shown)).

Continuous ranging addresses the two ranges r1 and r2 using separate signal amplification/gain chains that may be applied independently and/or concurrently. By way of example, specific implementations will be discussed below in the context of FIGS. 4 and 5. Addressing each range r1 and r2 separately and/or concurrently allows for configuration of the amplification chain for the non-active or "cold" range (i.e., the range not presently employed in the measurement, e.g., range r2 when $t<t_{TR}$ or range r1 when $t>t_{TR}$) based on the data being gathered by the active amplification change. Keeping the amplification chain for the non-active or cold range online concurrently with the active range measurement can avoid startup transients when the non-active range is finally engaged. It also allows for "range mixing," where the gain chains for each range are applied in combination in order to facilitate a smooth change in data over a transition Δt from range r1 to r2 (and vice versa). That is, amplification chains from both ranges can be applied simultaneously to smooth the data over range transition Δt. This can be done, for example, via software mixer and/or can then smoothly transition from r1 to r2 and vice versa.

Figure 4:
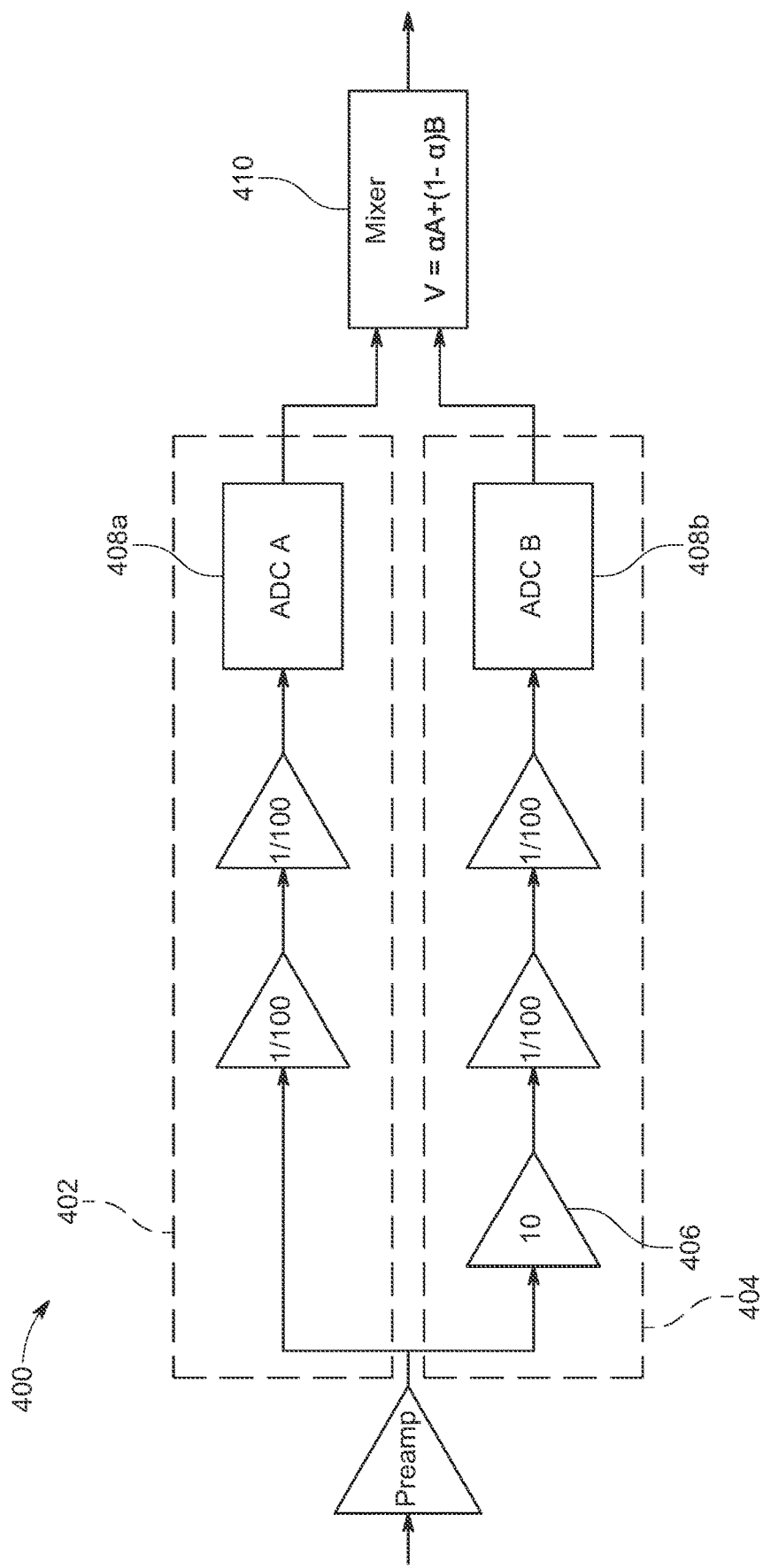
FIG. 4 is one variation 400 of implementing seamless ranging via dual amplification chains.

FIG. 4 is one variation 400 of implementing seamless ranging via dual amplification chains. As shown in FIG. 4, lower gain chain 402 (i.e., the gain chain having lower amplification) and higher gain chain 404 (i.e., the gain chain having higher amplification) are identical apart from 1) different ADCs (408a and 408b, respectively) and 2) an additional amplifier 406 in the higher gain chain 404, giving it a higher gain than lower gain chain 402. Outputs from ADCs 408a and 408b are combined by mixer 410 and used in the measurement pod's 104 acquisition routine for ranging measurements. In chain 400, the combination can be weighted by a factor α. Factor α can be chosen dynamically in order to ensure a smooth transition over ranging transition Δt (e.g., using range mixing to avoid discontinuity D in FIG. 3). While the factor α can be set by the user, it is often set by a ranging algorithm (e.g., algorithms 600, 650, 910, 1200, 1250, 1300, and 1400, discussed in more detail below).

Figure 5:
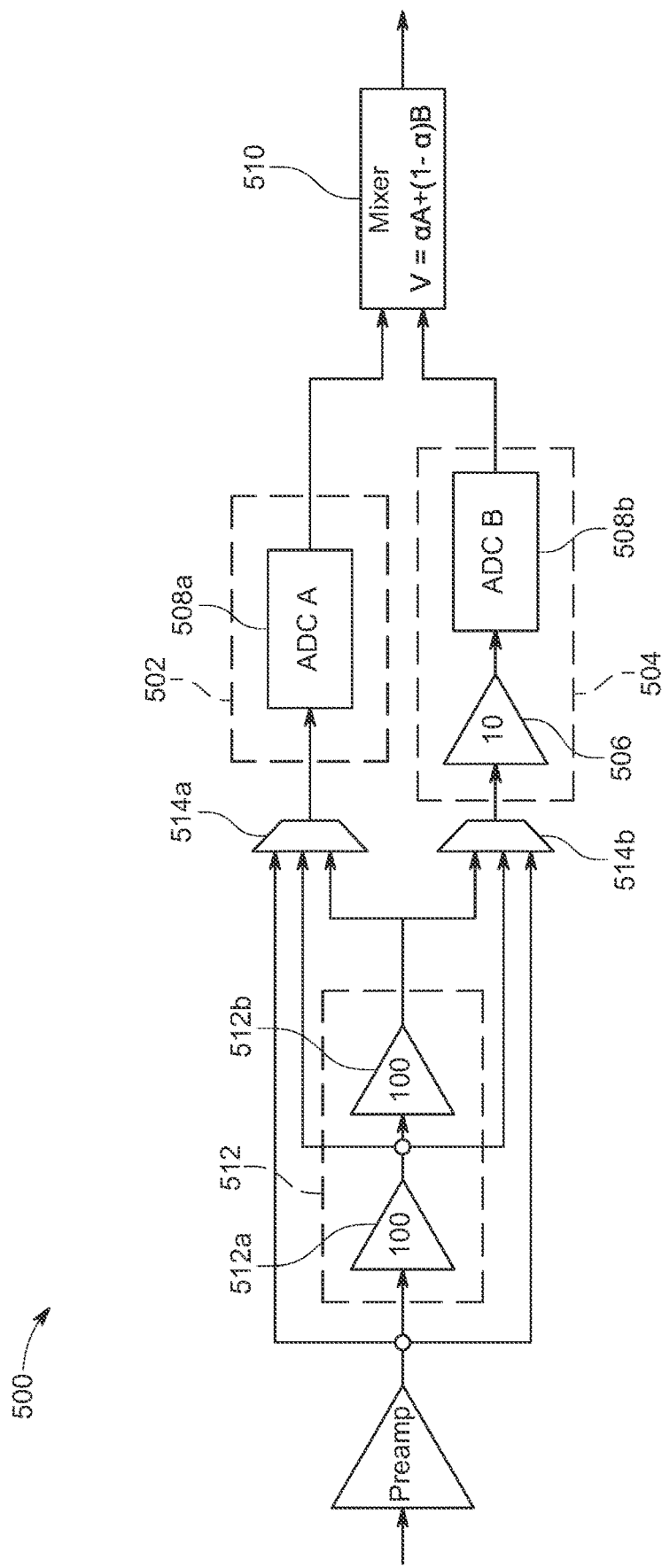
FIG. 5 shows another exemplary amplification chain 500 according to aspects of the present disclosure.

FIG. 5 shows another exemplary amplification chain 500 used in seamless ranging. Chain 500 includes lower gain portion 502 and higher gain portion 504, which are identical apart from: 1) different ADCs (508a and 508b, respectively); 2) an additional amplifier 506 in the higher gain portion 504 giving it a higher gain that lower gain portion 502; and 3) and lower gain portion 502 and higher gain portion 504 are connected to gain stages 512 via muxes 514a and 514b, respectively.

As shown in FIG. 5, the amplification supplied to lower and higher gain portions 502 and 504 from gain stages 512a and 512b can be selected via muxes 514a and 514b, respectively. In this way, chain 500 may use fewer dedicated amplifiers to provide the combination to mixer 510 than chain 400. Using the same gain stages 512a and 512b (and amplifiers) for lower and higher gain portions 502 and 504 is not just more efficient. It also introduces less noise in the system that can arise due to glitches or incompatibilities between different amplifiers. For example, each amplifier may have transients that are avoided when they are in constant use regardless of which range is being applied. Any idiosyncrasies, ranging issues, or errors caused by amplifiers 512a and 512b will be present in all ranges in which they are applied. As discussed in more detail below, this can assure consistency and smoothness in overall trends and behavior of measured data, aspects that are often more important in materials measurements than precisely measured amplitudes.

As in the case of chain 400, the combination in chain 500, mixing 510 can be weighted by a factor α. Factor α can be chosen dynamically in order to ensure a smooth transition over ranging transition Δt (e.g., using range mixing to avoid discontinuity D in FIG. 3). While the factor α can be set by the user, it is often set by a ranging algorithm (e.g., algorithm 600 shown in FIG. 6A). α can be set by any method described herein relating to gain, chain, or signal mixing.

Figure 6C:
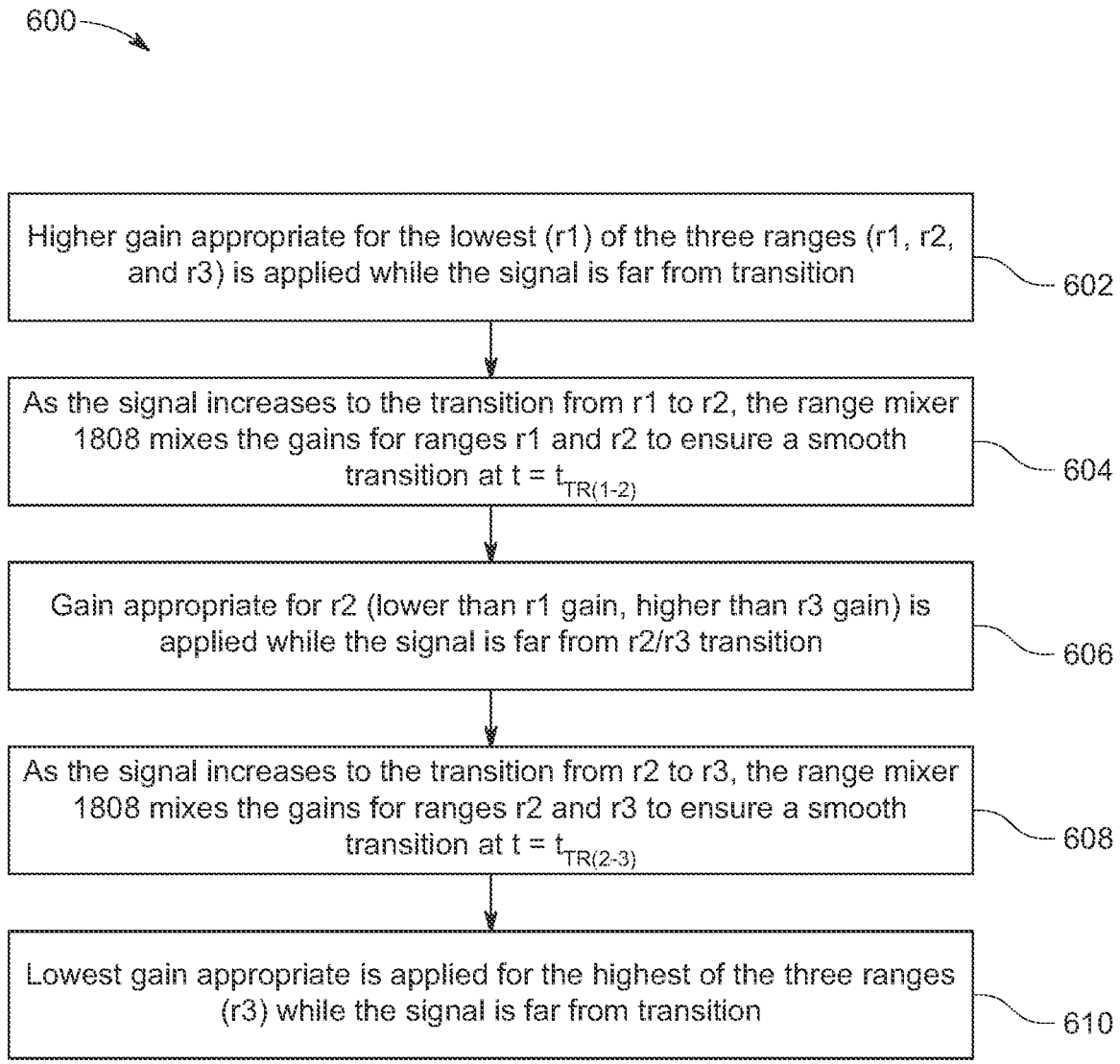
FIG. 6C shows algorithm 600 in the form of a flowchart.

In variations including chains 400 and 500, as well as others, seamless ranging may include auto-ranging. FIG. 6A provides an illustration of an auto-ranging algorithm 600 that may be used in conjunction with seamless ranging, e.g., in variations 400 and 500. FIG. 6C shows algorithm 600 in the form of a flowchart.

The algorithm 600 changes range as the measured signal 650 shown in FIG. 6B changes increases from range r1, r2, and r3. Signal 650 transitions from range r1 to r2 at $t=t_{TR(1-2)}$ and from range r2 to r3 at $t_{TR(2-3)}$. FIG. 6A shows the response of the algorithm 600, in terms of applying gain chains dedicated to ranges r1, r2, and r3, over those transitions.

As shown in FIGS. 6A and 6C, the algorithm 600 provides a gain configured for 100% r1 (e.g., drawing from higher gain portion 404 in chain 400 of FIG. 4 to provide higher gain to the lower of the two ranges) during the period 602, prior to the transition from r1 to r2 ($t_{TR(1-2)}$). FIGS. 6A and 6C also show that algorithm 600 mixes the gain profiles for r1 and r2 as the measured signal approaches the transition $t_{TR(1-2)}$ (e.g., drawing from higher gain portion 404 and lower gain portion 404). This pre-transition, r1/r2 mixing period is labeled 604. As discussed above, mixing avoids glitches and/or gaps in the data during the r1/r2 range transition. After the r1/r2 transition at $t_{TR(1-2)}$, the algorithm 600 applies r2 gain without mixing (e.g., drawing from lower gain portion 402 in chain 400 of FIG. 4). FIGS. 6A, 6B, and 6C show that the algorithm changes from r2 to r3 at $t_{TR(2-3)}$ in the same way, i.e., first by mixing gain profiles for r2 and r3 during period 608, then by providing r3 configured gain only during period 610.

FIG. 6A also shows a region of hysteresis 612 during period 606 (r2 only). During hysteresis 612, there is no anticipated ranging (i.e., only one gain portion of the gain chain is active, in this case the gain chain for r2). The applied gain during hysteresis may also be constant. This avoids switching back and forth between ranges due to noise or signal variation. Once the measured signal 650 edges closer to r3, the hysteresis period 612 ends. Period 614 represents a period in which a range change from r2 to r3 is anticipated by engaging the gain chain (not shown) for r3. The gain chain corresponding to r3 is engaged during 614 both for the purposes of calibration and to avoid transients, as discussed above. Although no hysteresis or anticipation of range up portions are shown for the r1/r2 transition, it is to be understood that they may be applied to that transition as well.

Though FIG. 6A shows operation of algorithm 600 as the measured signal increases, it is to be understood that the algorithm applies the same way with the measurement signal decreases (e.g., from higher range r3 to lower range r2, then to lowest range r1). This is shown via flowchart 620 in FIG. 6D. In this case, the algorithm 600 would have anticipate range down periods rather than anticipate range up periods (e.g., transitioning downward from r3 to r2 at $t_{TR(3-2)}$ (step 624 in chart 620), etc.).

Although FIGS. 6A, 6B, and 6C show algorithms 600 and 620 handling range changes among three exemplary ranges r1, r2, and r3, it is to be understood that it may handle range changes among any number of ranges suitable for the experiment in the same manner. Other variations of algorithms 600 and 620 can include many other algorithms and/or range/parameter settings and any suitable number of range transitions.

Mixers 410 and 510 in chains 400 and 500, respectively, can operate according to any suitable mixing algorithm to achieve the smoothing effect shown in FIG. 3 (302). Mixers 401 and 501 may be digital. They may have no need for independent calibration. In one variation, the mixed output of 410 and 510 may be controlled by algorithms similar to the following:

$$\text{output signal } V \text{ (for Mixer 402 or 502)} = \alpha E_A + (1-\alpha) E_B \quad (1)$$

where $E_A$ is the output of the first ADC (ADC A 408a or ADC A 508a), $E_B$ is the output of the second ADC (ADC A 408b or ADC A 508b), and α is a mixing parameter that can vary, for example, from one to zero.

It is to be appreciated that equation 1 is not the only mixing algorithm that can be applied by mixers 410 and 510. For example, mixers may simply average the outputs of each path to reduce noise. Equation 1 applies a linear weighting (α) to the contributions of $E_A$ and $E_B$. However, non-linear weightings are contemplated and should be considered within the scope of the present disclosure. In fact, the weighting may include any suitable mathematical form. Examples include, but are not limited to quadratic, cubic, and any suitable polynomial. Exponential and logarithmic functions, as well as differential equations, are all contemplated within the scope of this disclosure.

The exact form of the weighting or mixing function should depend on factors such as the gains of the various amplifiers in the system (e.g., amplifiers in 402, 404, and 512 and amplifier 506), as well as the other components, such as the ADCs (e.g., ADCs 408a, 408b, 508a, and 508b). It may also depend on the particulars of the mixers 401 and 510 used in the circuits. It may depend on the following exemplary characteristics of these components, e.g., frequency response, gain value, non-linearity, sensitivity to variations in input. In addition, parameter α, need not vary from one to zero, as in the example above. Parameter α, as well as any other value employed by mixers 410 and 510, can depend on the specifics of the gain stages in chains 402, 404, and 512 as well as gain 506. It may include any suitable value for balancing the gain and eliminating or diminishing discontinuity D (FIG. 3).

Figure 7A:
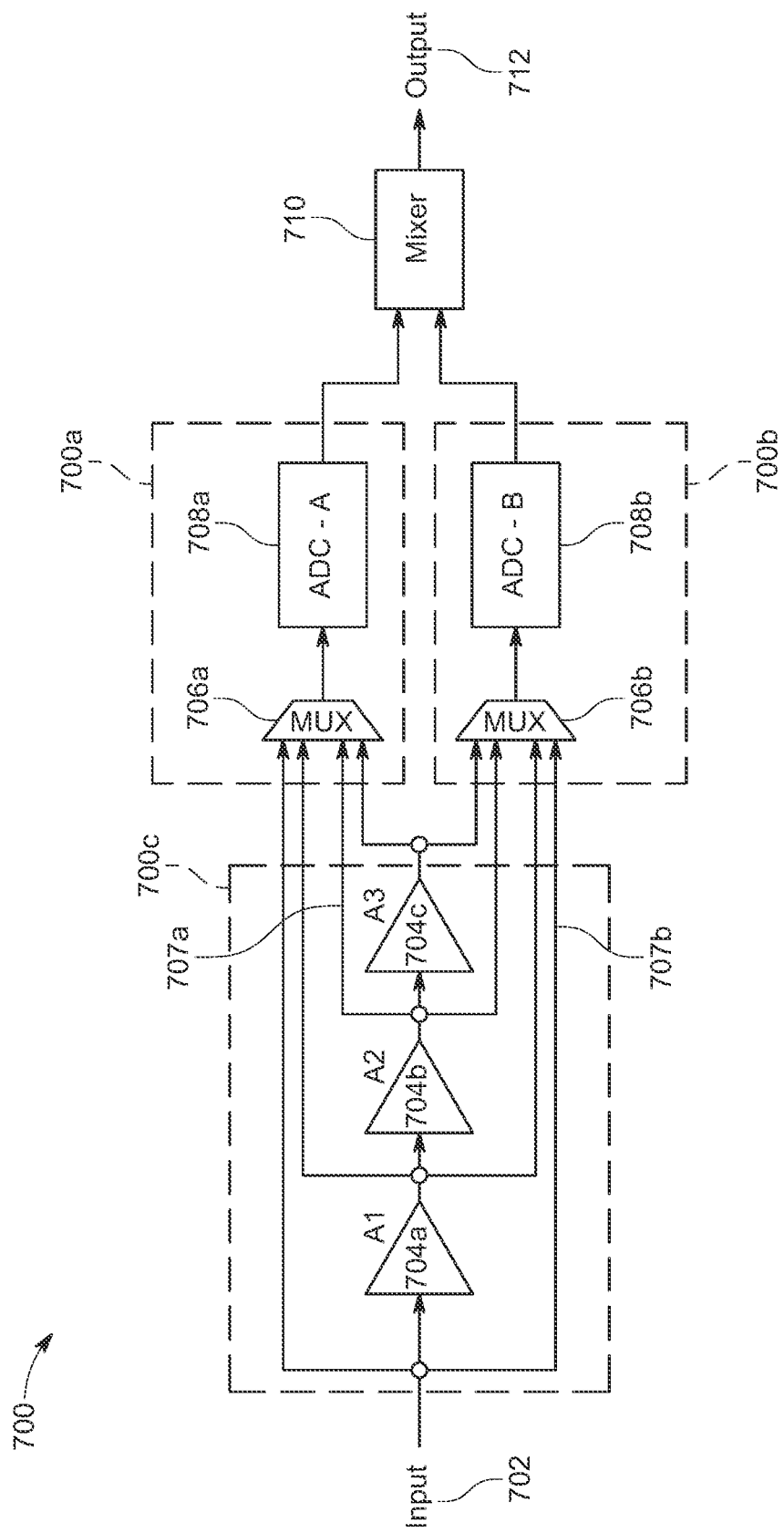
FIG. 7A shows another variation 700 that shares gain stages while using multiple ADCs (i.e., ADC A 708a and ADC B 708b) according to aspects of the present disclosure.
Figure 7B:
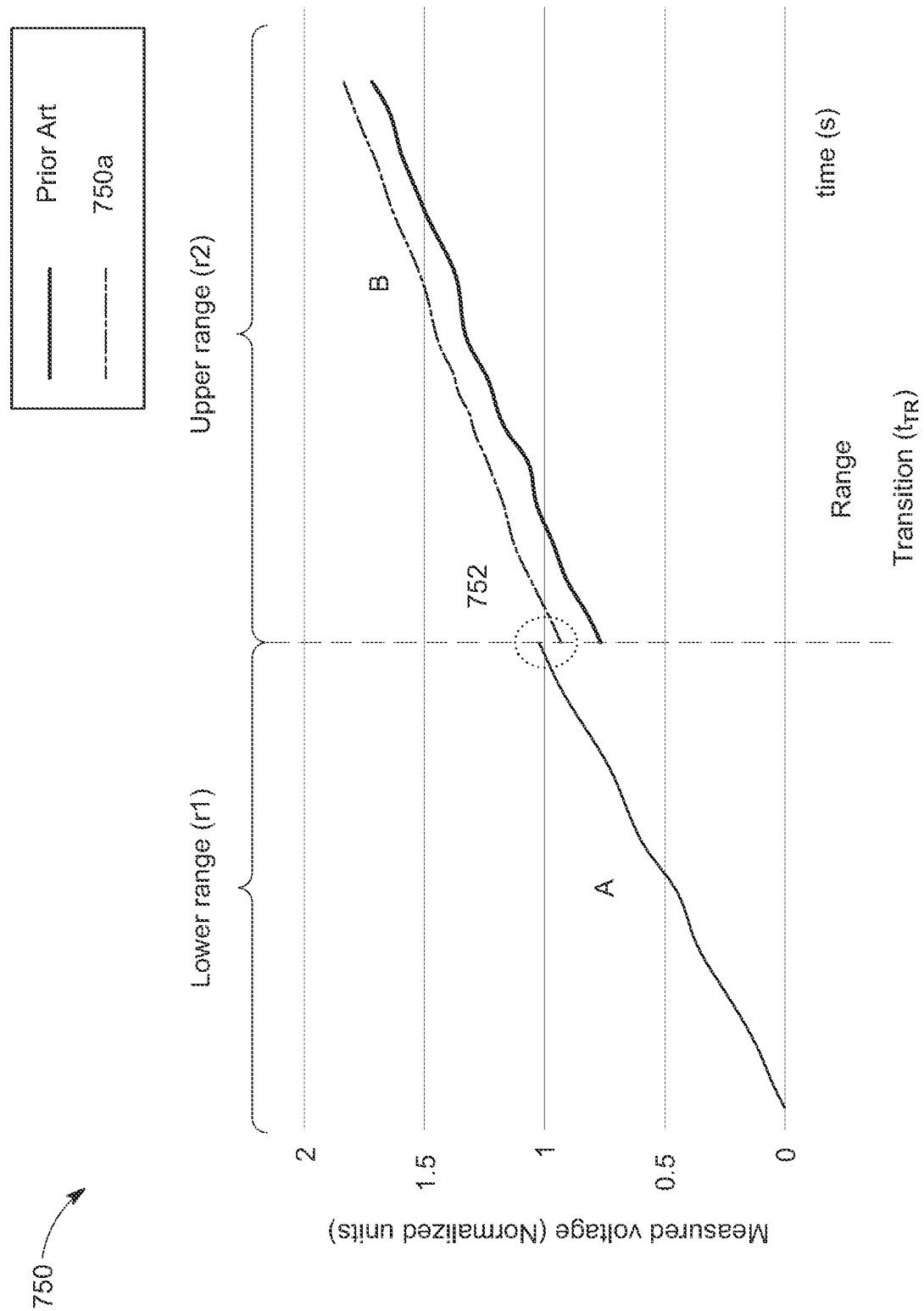
FIG. 7B shows that the measured signal 750a of variation 700 exhibits a discontinuity in magnitude 752 at r1/r2 transition at $t_{TR}$.

FIG. 7A shows another variation 700 that shares gain stages while using multiple ADCs (i.e., ADC A 708a and ADC B 708b). FIG. 7A shows the architecture of the chain 700 itself. FIG. 7B is plot 750 comparing the response 750a of chain 700 with a prior art, conventional ranging system such as 120.

Chain 700 includes two signal paths 700a and 700b inclusive of an ADC (ADC A 708a and ADC B 708b, respectively) and a multiplexer (mux, 706a and 706b, respectively). Multiplexers 706a and 706b select from gain stages 704a-704c from gain chain 700c. Therefore, signal paths 700a and 700b have independently configurable gains based on those selections.

Each independently configurable gain delivered to paths 700a and 700b can be any combination of the output of amplifiers 704a, 704b, and 704c having gains A1, A2, and A3, respectively. Each of gains A1, A2, and A3 may be 1, any suitable positive value greater than 1, and any suitable negative value with an absolute value greater than 1. Although the gains can be selected for any reason and based on any criterion, they are typically selected by muxes 706a and 706b based on the range of input signal 702 in order to best accommodate that signal. It is understood that many different combinations are possible and within the scope of the instant disclosure.

For example, the input signal 702 may be in a range that is best amplified by the combined gain from gain stages 704a and 704b (i.e., a gain equal to the product of A1 and A2) and ADC A 708a. This range may, for example, correspond to lower range r1 in FIG. 6A requiring a relatively high gain. In this case, mux 706a would select input 707a, to send that gain to ADC A 708a. After processing in ADC A 708a, the signal is sent to mixer 710. In this case, since the ADC A 708a is the appropriate range and signal, the mixer 710 would select only the ADC A 708a input (e.g., set α in equation 1 equal to 1). At the same time, mux 706b may be set such that ADC 708b has an configured gain for upper range r2. This may be a lower gain than for lower range r1 corresponding to a higher signal amplification. Merely by way of example, this lower gain may be A1. In this example, ADC B 708b is not used to generate output signal 712 as long as the input 702 is in range r1. Typically, one would say that the path 700b and its associated unused range are cold because they are not actively providing output to mixer 710. Even while cold, however, the path 700b may still be operational in order to avoid transients that occur during turn on or warm up.

If the input signal 702 increases such that it risks saturating ADC A 708a by closing in on transition $t_{TR}$, ADC B 708b (the "cold" range) may be engaged. The path associated with ADC B 708b can set to a higher range (lower gain). For example, ADC B 708b is fed the output of gain stage A1 (704a), which will result in ADC B 708b being in a higher range (lower gain) than ADC A 708a in path 700a.

While input signal 702 is at a desired level for ADC A708a, mixer 710 is set so that only output 712 receives only ADC A 708a's contribution. This corresponds to lower range r1 in FIG. 3, far from transition point $t_{TR}$. However, as input signal 702 increases toward $t_{TR}$ (and upper range r2, for which ADC B708b is configured), it becomes more advantageous for ADC B 708b to take over processing. Before the transition $t_{TR}$, ADCs 708b "warms up" by starting to measure input signal 702. In this configuration, which corresponds to step 614 in FIGS. 6A and 6C, mixer 710 is still set such that only the signal from ADC A 708a is sent to output 712. Once transients in the ADC B 708b processing of the input signal 702 die off, mixer 710 starts to provide to output 712 a signal that is a combination of outputs from ADC A 708 and ADC B 708b. This mixed output can be, for example, according to equation 1. Mixer 710 gradually increases the contribution from ADC B 708b, until the system is well in range r2. At that point, corresponding to step 606 in FIGS. 6A and 6C, mixer 710 may shut off or eliminate the contribution from ADC A 708a. This is because ADC B 708b is configured for r2. In the example case, mux 706b is set such that ADC B 708b receives lower gain (A1 only, as opposed to the product of A1 and A2). This corresponds to input 707b. The generation of output 712 by mixing signals from the two ADC paths 700a and 700b to smooth the transition over D (FIG. 6A) is seamless ranging.

Figure 1:
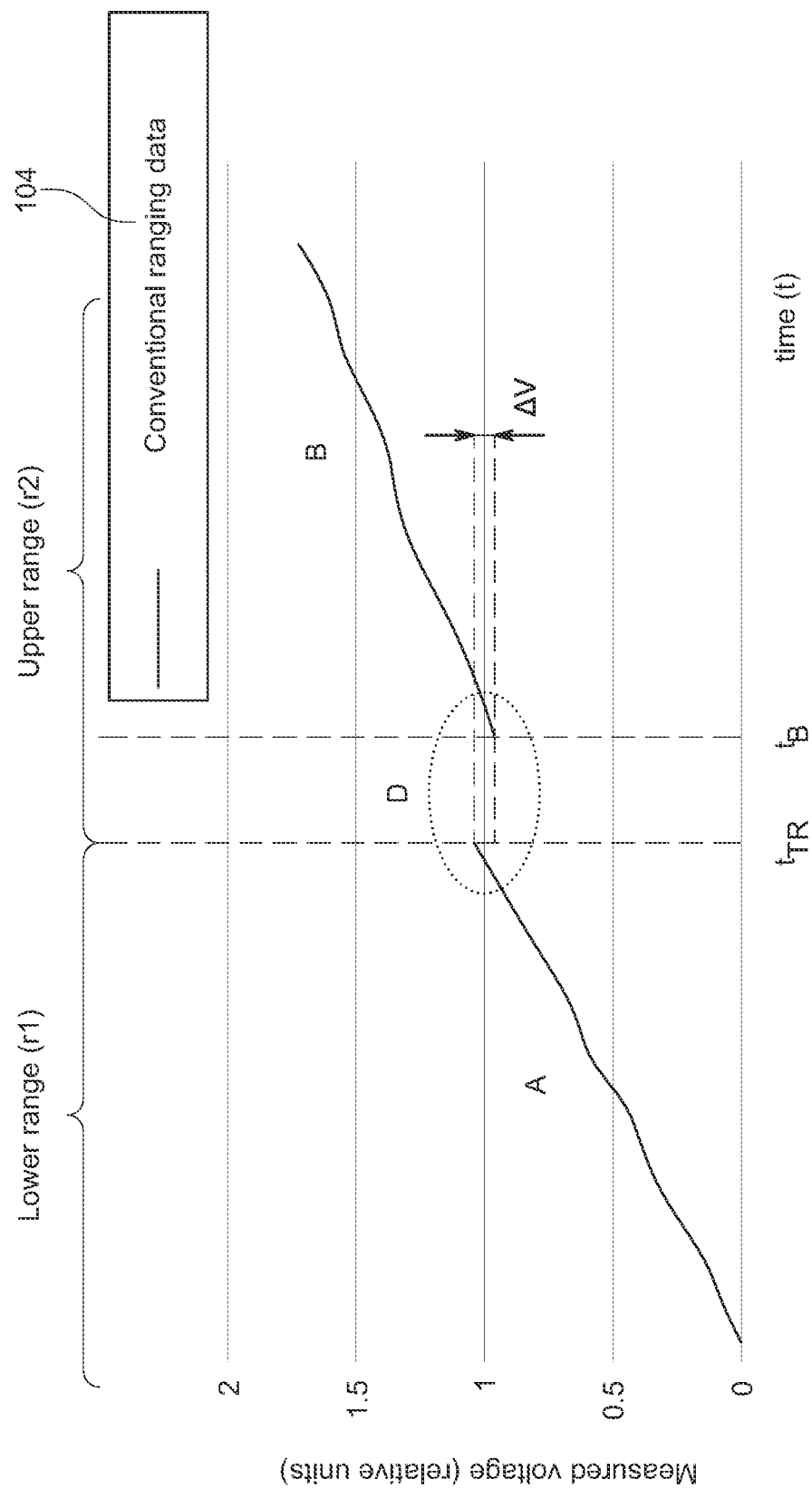
FIG. 1 shows the effect of a range transition on data collected by a typical measurement system without seamless ranging capabilities.
Figure 2:
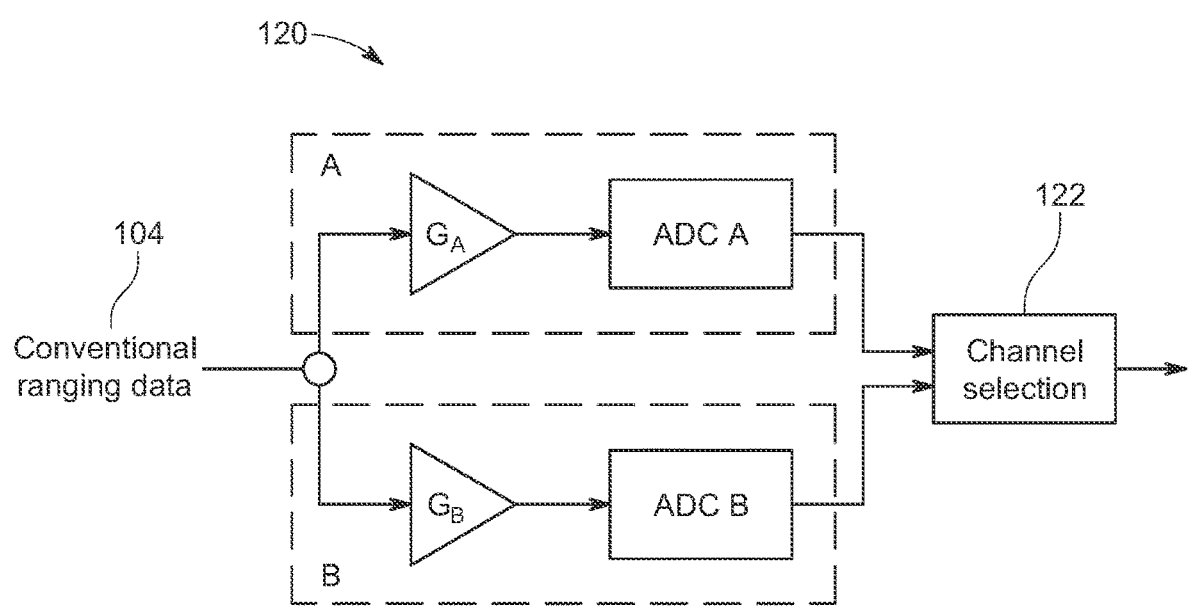
FIG. 2 shows an example of a conventional ranging setup 120 that can cause the discontinuity D shown in FIG. 1.

In this scenario, idiosyncrasies and/or errors associated with gain stage 704a (gain of A1) are common between to the measured signal 750a (FIG. 7B) of both ranges r1 and r2 and their range paths 700a and 700b, respectively. Therefore, the range to range transition $t_{TR}$ has gain commonality. This reduces the discrepancy between ranges. The effect on measured data is shown schematically in FIG. 7B. Specifically, FIG. 7B shows how a signal 750a measured by 700 is more similar in ranges r1 and r2 (portions A and B, respectively) than the same output measured by a prior art configuration (e.g., 100 shown in FIG. 1). In other words, measured signal 750a is more similar when they are measuring the same signal (seamless ranging) as compared to the completely different sets of gains in each range (prior art). In FIG. 7B, both the prior art system and seamless ranging system 750a have the same output for portion A (range r1).

Once the input signal 702b passes to ADC B 708b, ADC A 708a is now cold. Even while cold, the gain of ADC A is 708a remains configured to anticipate where the signal will go next. ADC A 708a could, for example, stay in r2 configured range to anticipate a return to that range. Alternatively, ADC A 708a may change its range by resetting mux 706b for another gain. ADC A 708a may do this in anticipation of the signal continuing to increase or decrease, depending on the initial conditions of each signal path.

Figure 6D:
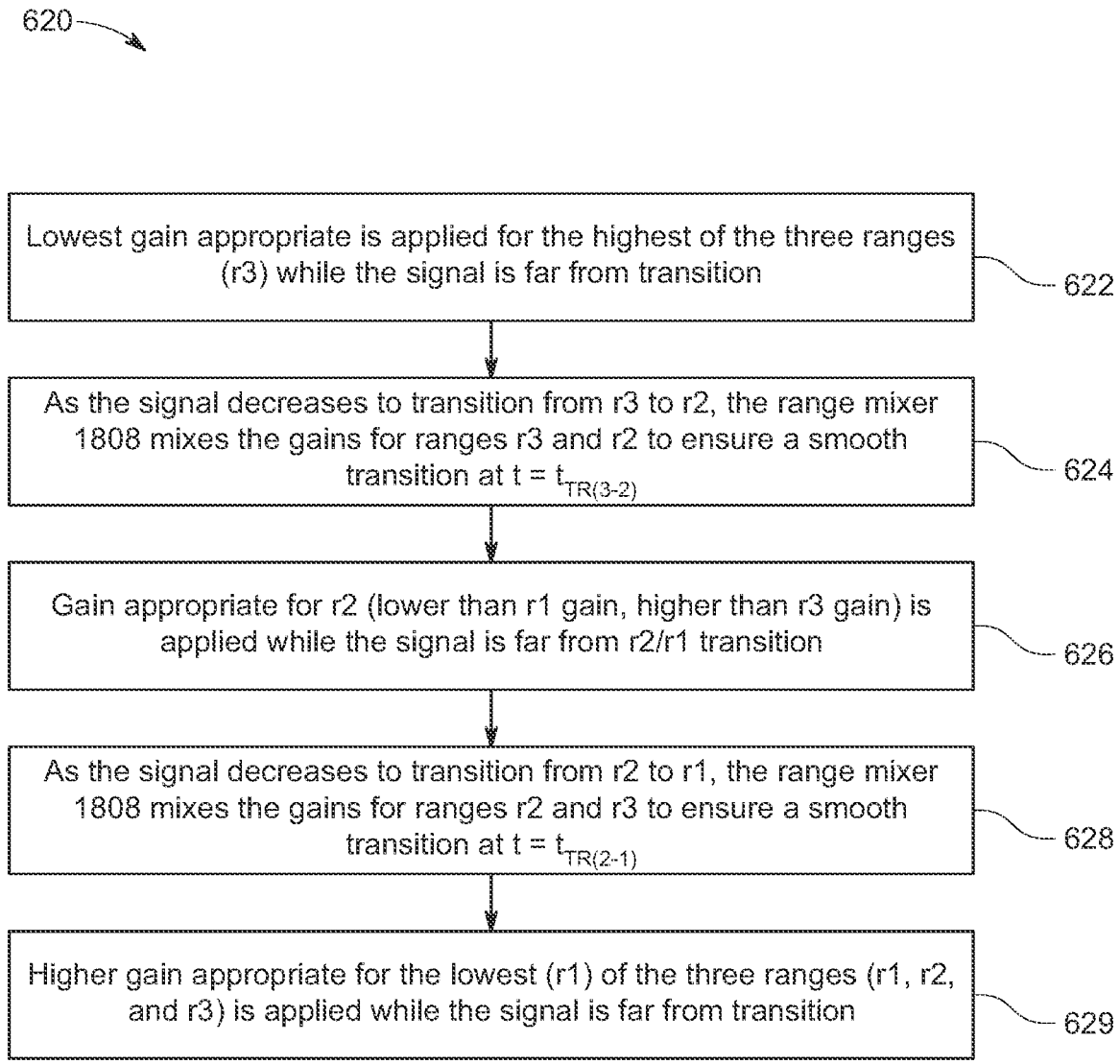
FIG. 6D shows another auto-ranging algorithm 620 in the form of a flowchart.

As discussed in the context of FIG. 6D, the above-described transition could be run in reverse for a decreasing input signal 702. In other words, if signal 702 is decreasing from range r2 to r1, mixer would first be set to feed to output 712 only the contribution from path 700b. This is because ADC B 708b is configured for range r2 by setting mux 708a to receive input 707b (lower gain A1). As input 702 decreases toward $t_{TR}$, ADC 708a is warmed up and turned on so that transients die off. In this phase, mixer 712 is still set such that output 712 receives only the 708b contribution. Once input 702 is close to $t_{TR}$, mixer 710 is set to combine 700a and 700b contributions to create a seamless transition. As input 702 decreases beyond $t_{TR}$ to r1, mixer 710 is reset so that only the configured path for r1 (i.e., 700a including ADC A 708a) contributes to output 712. As discussed in the above example, this gain may be the product of A1 and A2 set by mux 706a.

In a system with many gain stages like 700, the input signal 702 can be passed back and forth between the ADCs 708a and 708b as the input signal increases or decreases. Each time the cold ADC would anticipate the range needed for the changing signal, as described above. During this process, gain can be changed for the cold ADC while the output is being taken from the active ADC. This results in a constant output in the desired range, and results in reduced discrepancies due to gain variations in each range, as shown in FIG. 7B.

FIG. 7B shows that the measured signal 750a exhibits a discontinuity in magnitude 752 at r1/r2 transition at $t_{TR}$. This is merely for the purposes of illustration and may not be present in all implementations. Discontinuity 752 arises from the situation in which the gains applied to paths 700a and 700b, configured for each range r1/r2, are slightly incompatible at transition $t_{TR}$. In many variations, it may be possible to tune the gains for each path 700a and 700b to eliminate discontinuity 752. However, it may be more important to configure the gains to best represent their respective ranges. In this case, discontinuity 752 would be a known artifact of the measurement electronics and can be dealt with in a number of ways in post processing of the measured data 750a (e.g., by curve fitting/smoothing, etc.).

Figure 8:
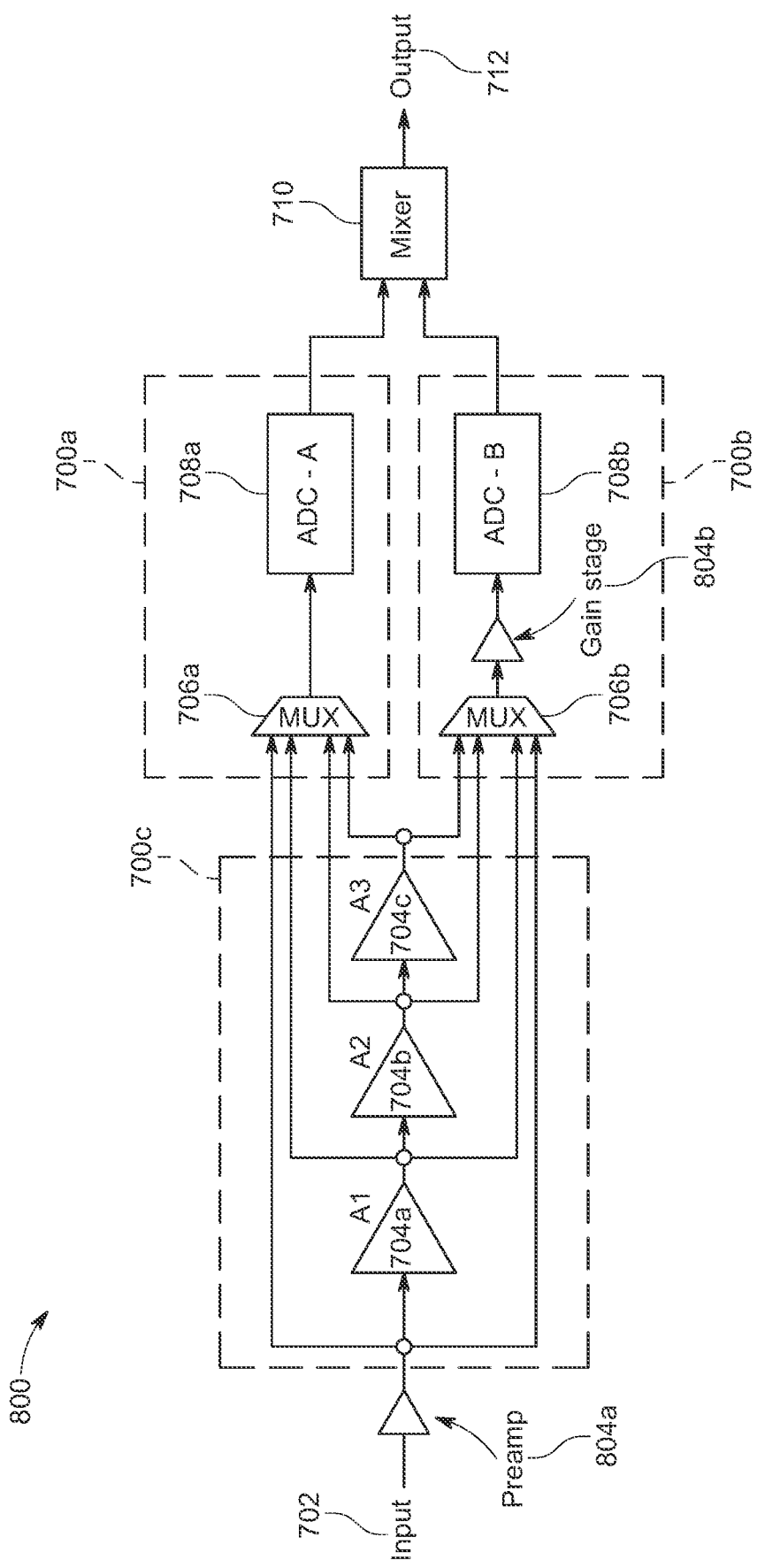
FIG. 8 shows another variation 800 that places a preamplifier (pre-amp) 804a prior to gain chain 700c and/or a pre-amp 804b in one of the two paths according to aspects of the present disclosure.

FIG. 8 shows another variation 800 that places a pre-amplifier (pre-amp) 804a prior to gain chain 700c and/or a pre-amp 804b in one of the two paths. FIG. 8 shows pre-amp 804b in path 700b associated with ADC B 708b. However, it is to be understood that pre-amp 804b could also be placed in a similar position in path 700a associated with ADC A 708a. Aside from the addition of pre-amps 804a and 804b, variation 800 is identical to variation 700 of FIG. 7A.

Pre-amps 804a and 804b can provide several benefits to variation 800. For example, pre-amp 804a can buffer input signal 702 from other components in variation 800. This can be advantageous because connecting the input 702 directly to multiple buffers or switching elements degrades performance. These elements often impart bias currents and switching capacitance to the input 702. Pre-amp 804b can be placed in the path (either 700a or 700b) associated with a range that typically requires an extra gain. This can be, for example, the lowest range (e.g., range r1 in FIG. 6A). Having an extra gain stage "hard wired" into one of the paths makes applying the appropriate gain to that path simpler and easier.

Figure 9:
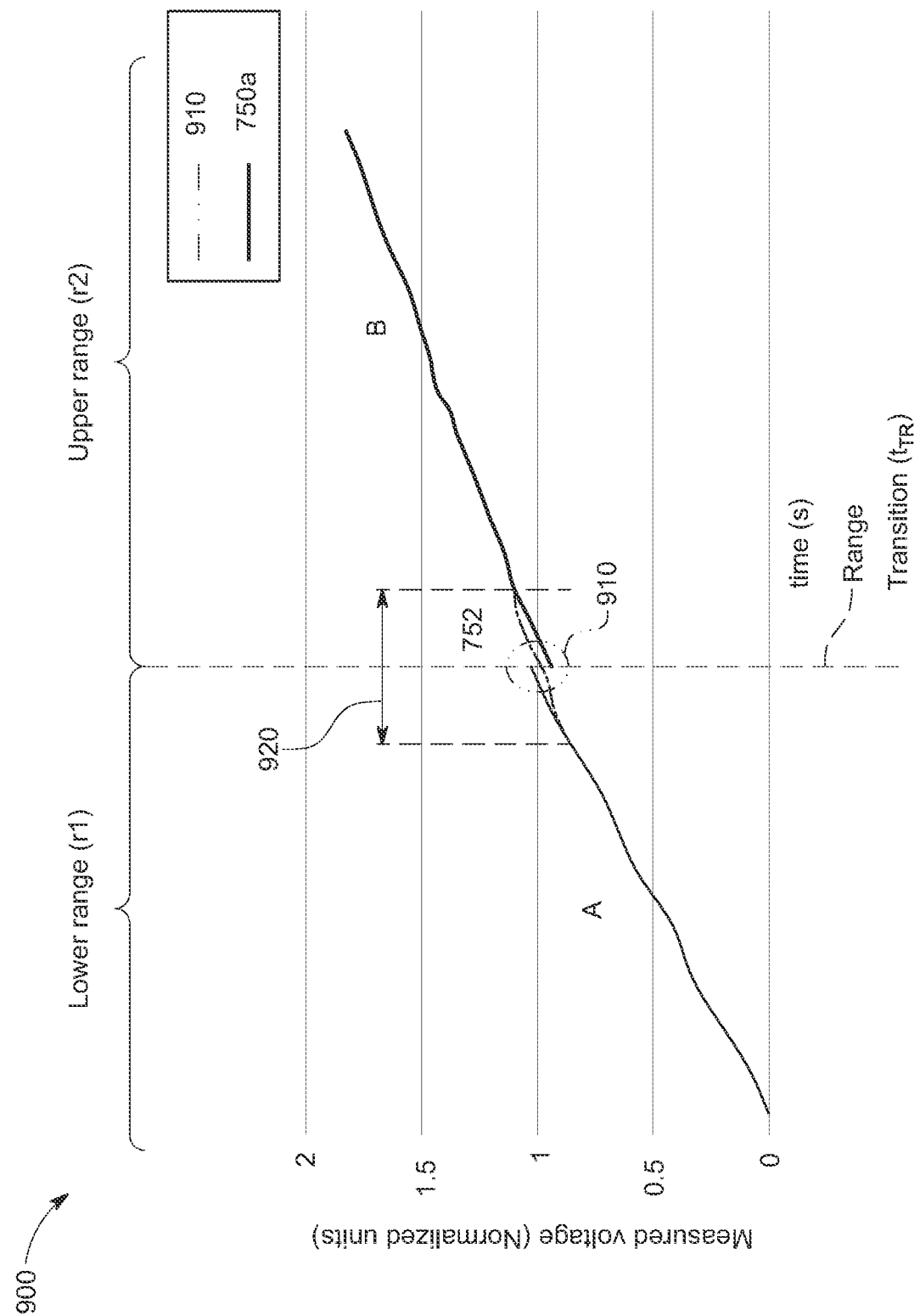
FIG. 9 shows an interpolation algorithm 910 directed at eliminating or diminishing discontinuity 752 according to aspects of the present disclosure.

FIG. 9 shows an interpolation algorithm 910 directed at eliminating or diminishing discontinuity 752. Algorithm 910 may be performed by mixer 710 (FIGS. 7 and 8) for both paths 700a and 700b.

In some applications, particularly in material research, the discontinuity 752 itself may be bigger problem than other sources of quantitative error. This is especially true with the overall character of the measured signal 750a, rather than its precisely measured value, is most important for describing materials properties. In many instances the measured value may be assessed in relative or normalized terms, to emphasize the behavior over the precise amplitude. In these cases, mixer 710 can interpolate its two inputs from ADCs 708a and 708b in order to maintain a smooth transition between ranges r1 and r2. Such an interpolation can be performed via equation 1. It can also be performed using another suitable mathematical or signal processing means for interpolating the signals from ADCs 708a and 708b. As shown in FIG. 9, the interpolation 910 is typically performed only over a time period 920 close to the transition time $t_{TR}$. Time period 920 may correspond, for example, to Δt shown in FIG. 3. However, it is to be understood that the interpolation 910 need not be limited to any particular time period. Since the contribution of each of the signals from the two ADCs 708a and 708b is variable, the interpolation 910 may be executing throughout measurement.

Figure 10A:
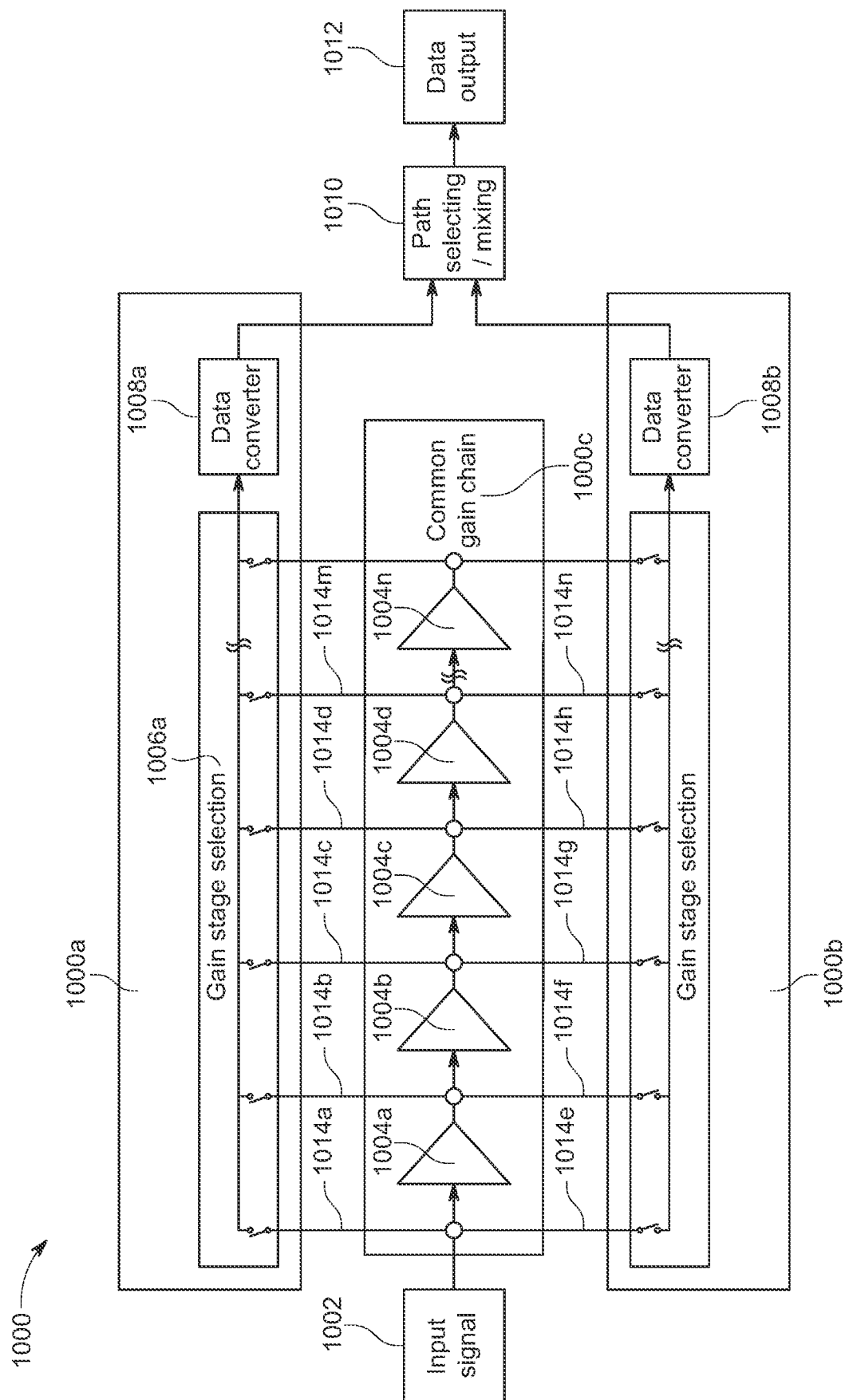
FIG. 10A shows a generalized variation 1000 of gain selection that may be used in accordance with the present disclosure.

FIG. 10A shows a variation 1000 that includes additional latitude for gain with selection for each path 1000a and 1000b associated with multiple amplifiers 1004a-1004n in common gain chain 1000c. Gain stage selection can be made in variation 1000 by two series of switch banks 1006a and 1006b. Each bank includes switches, e.g., switch 1014a that can connect or disconnect a data converter (e.g., ADC) 1008a or 1008b to each gain stage in the chain 1000c. The way each amplifier 1004a-1004n can be independently connected.

It is to be understood that the switch banks 1006a and 1006b can be implemented in a number of suitable ways. Solid state switching can be used. Alternatively, mechanical relay switching can be used. Any other suitable switching or connection method can be used. The individual switches (e.g., 1014a) may be present and operated individually. Alternatively, they may be operated as part of an integrated circuit or other integrated device. They may be triggered by any suitable means, including by user input, any of the algorithms described herein (e.g., algorithms 600, 620, and 910, etc.) Moreover, the switch banks 1006a and 1006b may be operated dynamically such that the switching and the gains fed to data converters 1008a and 1008b can be changed dynamically (e.g., at any point in ranges r1 and r2 in FIG. 6A).

FIG. 10A illustrates how gain paths can be made that use the common gain chain to amplify an input signal. The points in the common gain chain 1000c, before or after each gain stage 1014a-1014n, can be selected by multiple ranges. In FIG. 10A, a switching means 1006a and 1006b and/or controller can be used to select the point on the common gain chain 1000c and pass the input signal to either the top data converter 1008a or the bottom data converter 1008b.

As shown in FIG. 10A, mixer 1010 selects or mixes the output from data converters 1008a and 1008b to feed to data output 1012. Mixer 1010 can operate in a similar or the same way as mixers 410, 510, and 710. For example, mixer 1010 may use equation 1 to mix 1008a and 1008b outputs. It may do so based on any information used by mixers 410, 510, and 710 (e.g., user input, algorithm 600, etc.).

Although FIG. 10A shows only two converters, it is to be understood that variation 1000 (as well as variations 500, 700, and 800) can be used with any suitable number of data converters. One exemplary configuration is to assign a data converter for each independent range. Therefore, if the measurement includes four ranges, r1-r4, for example, four independent data converters may be used.

FIG. 10A shows the variation 1000 includes any number (n) of gain stages 1004-1004n in gain chain 1000c. Generally, the more gain stages included in 1000c, the more flexibility to allow data converters 1008a and 1008b to represent a particular range. In several variations, such as variation 1000, n outnumbers the number of data converters 1008m by a factor of two or more.

Although FIG. 10A shows gain stages 1004a-1004n appearing to be the same or similar type, this is not necessarily the case. In variations, it may be advantageous to use different types of gain stages with different gains. A benefit from having a common gain chain 1000c is fewer parts of the system need to be calibrated. In conventional systems, two completely independent gain paths needed to be calibrated. In this disclosure, the gain stages can be calibrated independent from the ranges. This can decrease the time it takes to calibrate the overall system.

Typically, most or all the gain stages in chain 1000c are active. In some cases, it may be useful to deactivate certain gain stages 1004a-1004n while not in use (e.g., to generate active or anticipated ranges). For example, some types of gain stages 1004a-1004n may not handle saturation well without producing errors. In that case, such gain stages would advantageously deactivate once a risk of saturation was detected. Doing so may allow for faster transitions (i.e., by activating a range only when that range is able to properly amplify the signal). Unused ranges 1004a-1004n could also be deactivated to reduce power draw, heat generation, etc.

Figure 10B:
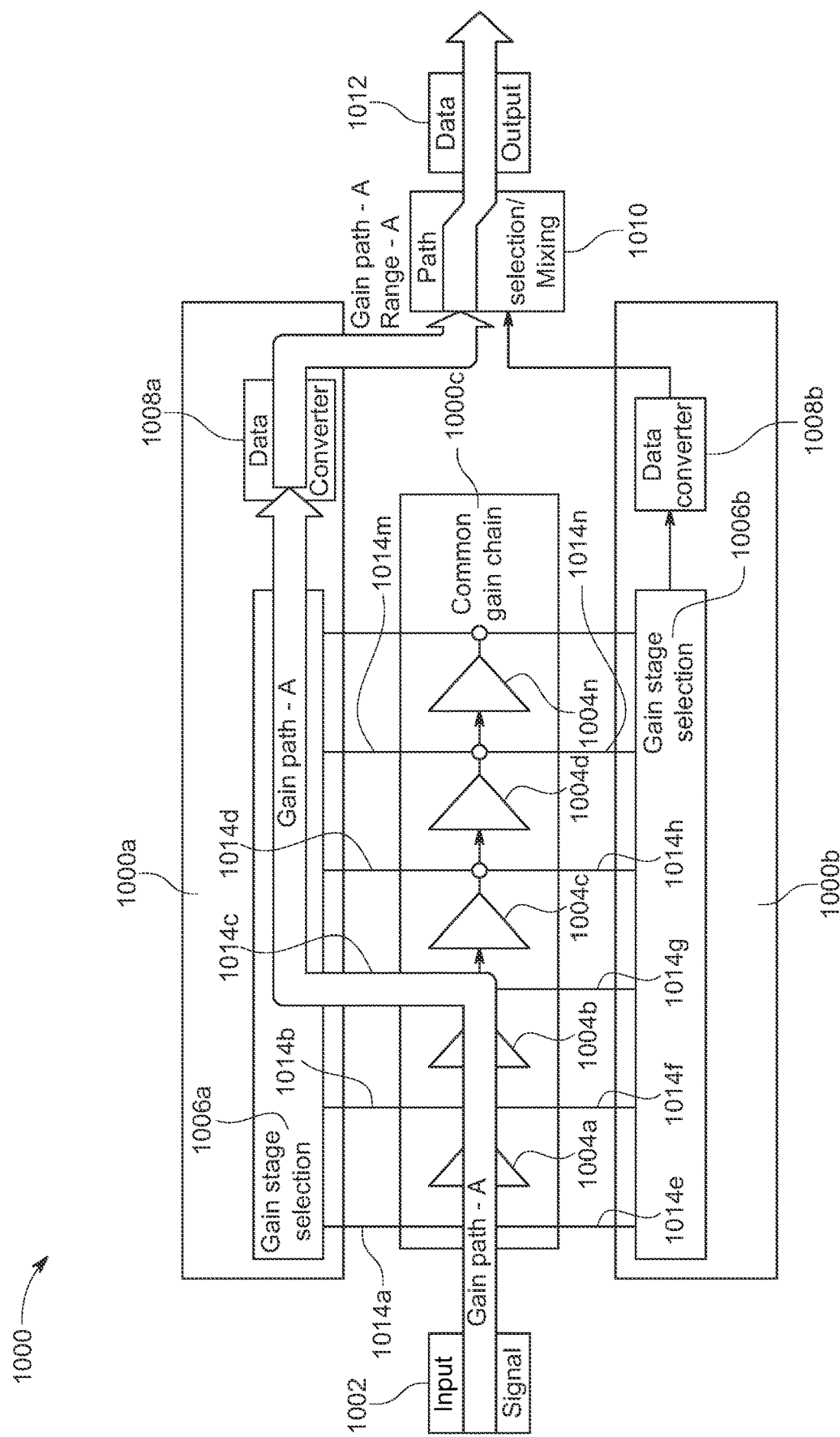
FIG. 10B shows an exemplary gain path (Gain Path A) that may be created using variation 1000.

FIG. 10B shows an exemplary gain path (Gain Path A) that may be created using variation 1000. To create Gain Path A, switch 1014c is engaged. This causes Gain Path A to be amplified by gain stages 1004a and 1004b (and no other gain stages). The amplified signal is then sent to data converter 1008a. The path is then mixed with another path by mixer 1010 and sent to data output 1012. In variations, mixer 1010 may send only the signal from Gain Path A to data output 1012. In others, it may mix paths by any of the means or algorithms disclosed herein (e.g., equation, algorithm 600, etc.).

Figure 10C:
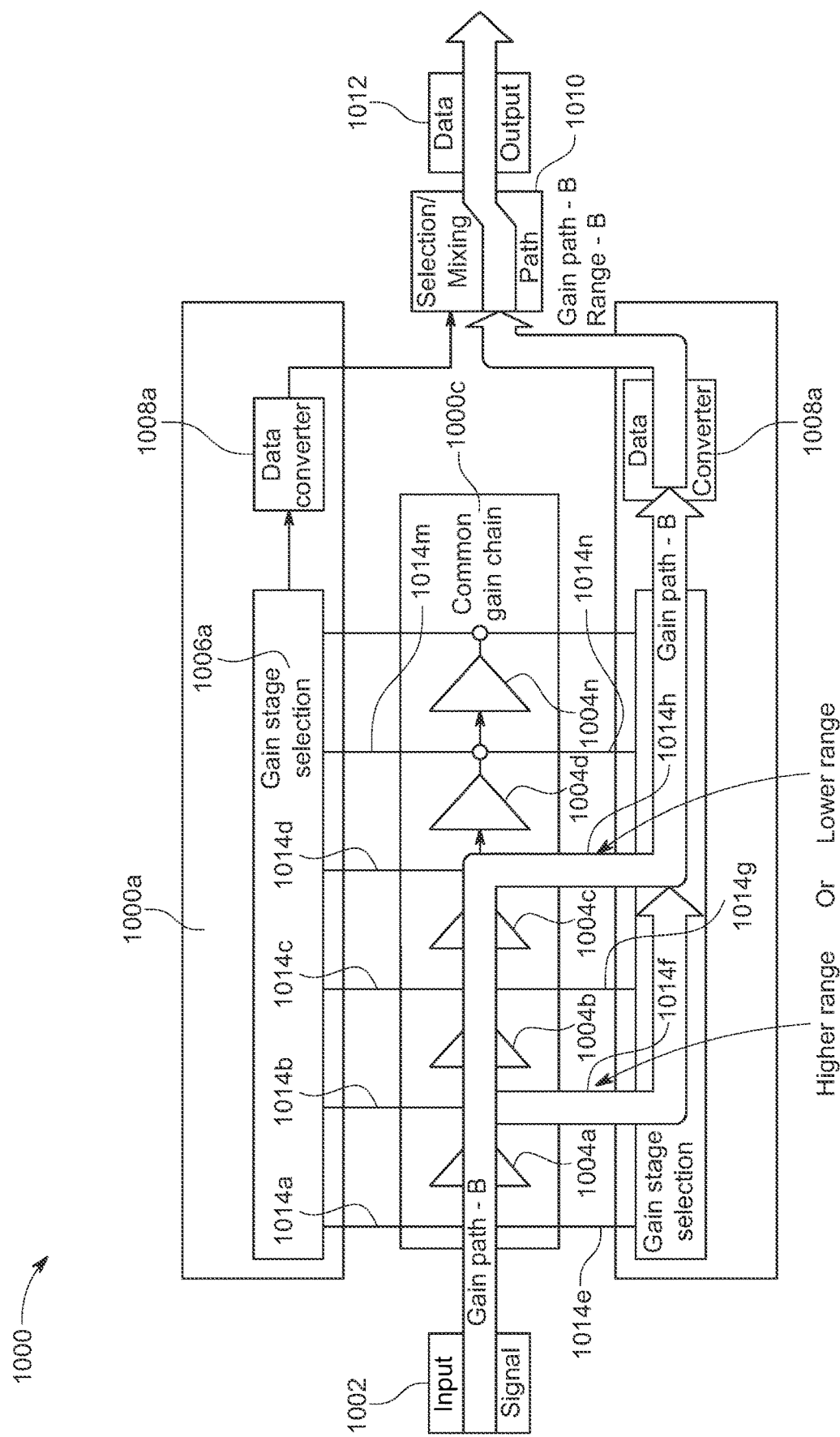
FIG. 10C shows another gain path (Gain Path B) of variation 1000 that includes two variations, a high range and a low range variation.

FIG. 10C shows another gain path (Gain Path B) that includes two variations, a high range and a low range variation. Both high and low variations use data converter 1008b instead of converter 1008a. Therefore, Gain Path B can be separately and independently engaged with Gain Path A. Gain Paths A and B can be mixed together by mixer 1010 to form data output 1012.

The higher range path of Gain Path B includes less gain and may be more appropriate for a higher range (e.g., r2 in FIG. 6A). It does so by triggering switch 1014f, which causes the path to include gain from only one stage, i.e., 1004a. The lower range path is obtained by triggering switch 1014h while switch 1014f is not triggered. The lower range path includes two extra gain stages, i.e., 1004b and 1004c, along with gain stage 1004a. This gives it a much higher gain that may be more appropriate for a lower range (e.g., r1 in FIG. 6A).

Variation 1000 may switch between any of these gain paths, as needed. It may do so, for example, according to any of algorithms 600, 620, and 910. For example, since Gain Path A is lowest gain, variation 1000 may use Gain Path A initially. It may simultaneously have Gain Path B online to warm it up and remove transients. In this scenario, Gain Path B would be in its lower range configuration in anticipation that the measured signal would use this first since it is increasing from a lower range (i.e., the lower range associated with Gain Path A). As the measured signal continues to increase, mixer 1010 may mix Gain Paths A and B, with Gain Path B being in the lower range configuration. As the measured signal continues to increase, the mixer 1010 may send only Gain Path B to data output 1012. As the signal continues to increase beyond this point, the higher range configuration of Gain Path B may be triggered by flipping 1014h off and 1014f on. This would give the input signal 1002 the least amount of gain (i.e., only the gain from gain stage 1004a) corresponding with being in the highest range.

Figure 11:
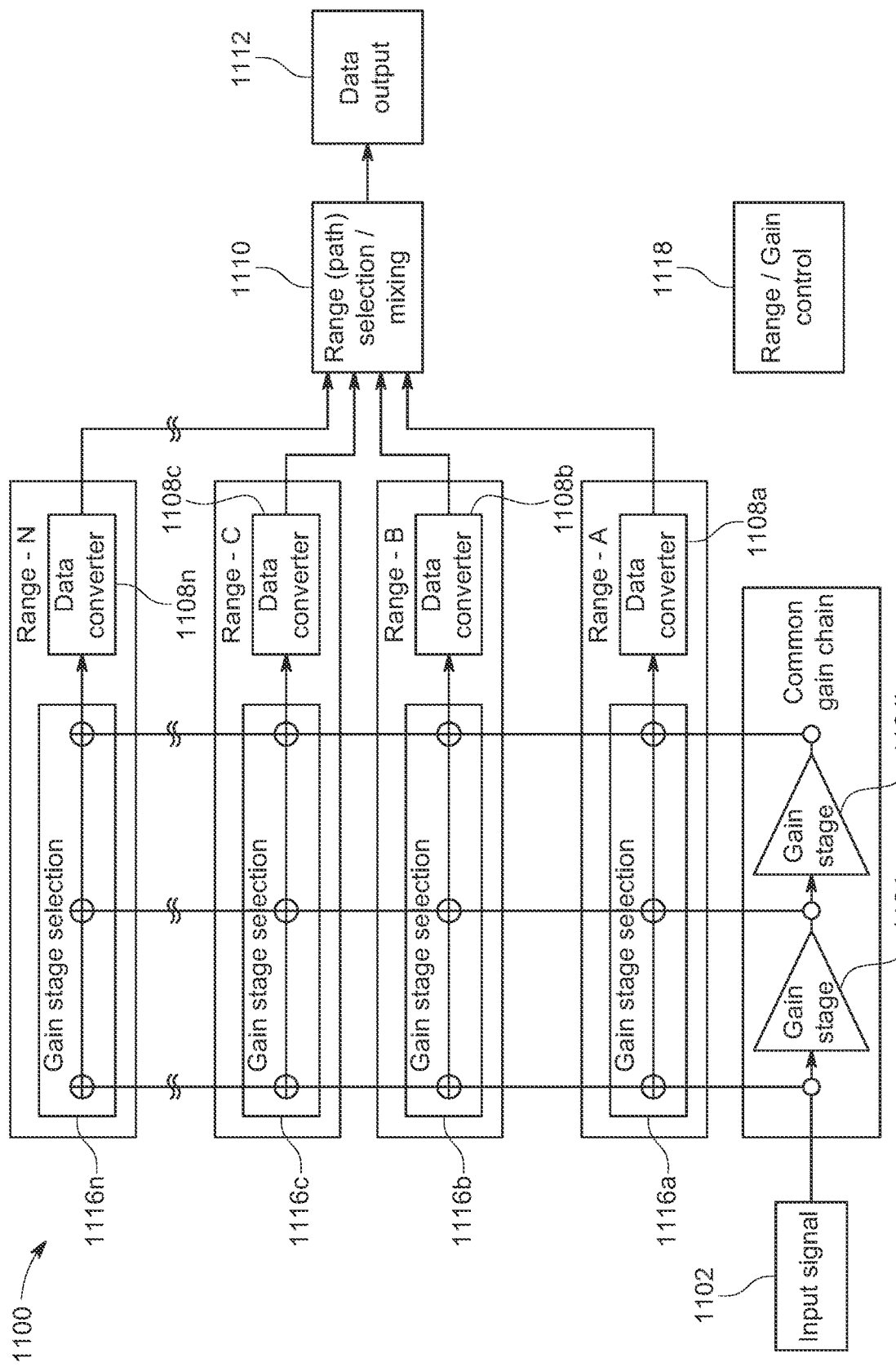
FIG. 11 shows another variation 1100 that includes variable gain selection by via gain stage selectors 1116a-1116n according to aspects of the present disclosure.

FIG. 11 shows another variation 1100 that includes variable gain selection by another means, namely gain stage selectors 1116a-1116n. Variation 1100 selects gain from gain from among two stages 1104a and 1104b. However, it is to be understood that this is merely exemplary. Any suitable number n of gain stages 1104 may be included in 1100.

In variation 1000, each data converter 1108a-1108n is connected to its own gain stage selector 1116a-1116n. However, other configurations where data converters 1108 share gain stage selectors 1116 are also possible.

Variation 1100 includes a number of data converters n that can be large. In general, the number of converters n can be chosen so that there is one converter for each range. In other situations, it may be advantageous to include either more converters than ranges or fewer. Multiple ranges/gain stages are also useful, for example, in measuring pulse input signal applications. If the input signal transitions multiple ranges, then it may be useful to measure that pulse across several ranges with different gains. It is to be understood that any suitable number of gain stages, greater or less than n, may be used.

It can be useful to have a range which always measures at a point in the common gain chain, while other ranges pass the signal back and forth between desired gains. One variation can use a low-cost ADC to initialize the input signal with a low gain and use this information to quickly configure the gain in high quality ADCs. This may be valuable for inputs that change between different sources. Input signals with large amplitude spikes can also cause problems for measurement systems. Therefore, by having a multitude of ADCs measuring simultaneously, one can achieve accurate measurements when the input is in its "normal" range, but still be able to measure a signal spike. In other variations, input can benefit from using different types of ADCs simultaneously to measure the signal. High speed ADCs along with high resolution ADCs would allow for different types of signals to be measured and converted without sacrificing performance. All of these variations can use the anticipation algorithm, along with other ADCs measuring the input signal for other purposes. Many communication signals exhibit this type of signal characteristic.

As shown in FIG. 11, variation 1100 includes a range mixer 1110. Range mixer 1110 mixes the outputs of data converters 1108a-1108n to provide to data output 1112. Range mixer 1110 can mix the outputs according to any method disclosed herein in the context of other range mixers (e.g., in the context of range mixer 1010). Many different types of mixing algorithms can also be designed to combine the different ranges to more accurately measure a changing input signal.

As shown in FIG. 11, each gain stage selector 1116a-1116n can provide any combination of gain stages 1104a and 1104b to data converters 1108a-1108n. The combination can be selected by any means of gain selection disclosed herein, including by user input, any of the algorithms disclosed herein (e.g., 600, 620, and 910).

Figure 12A:
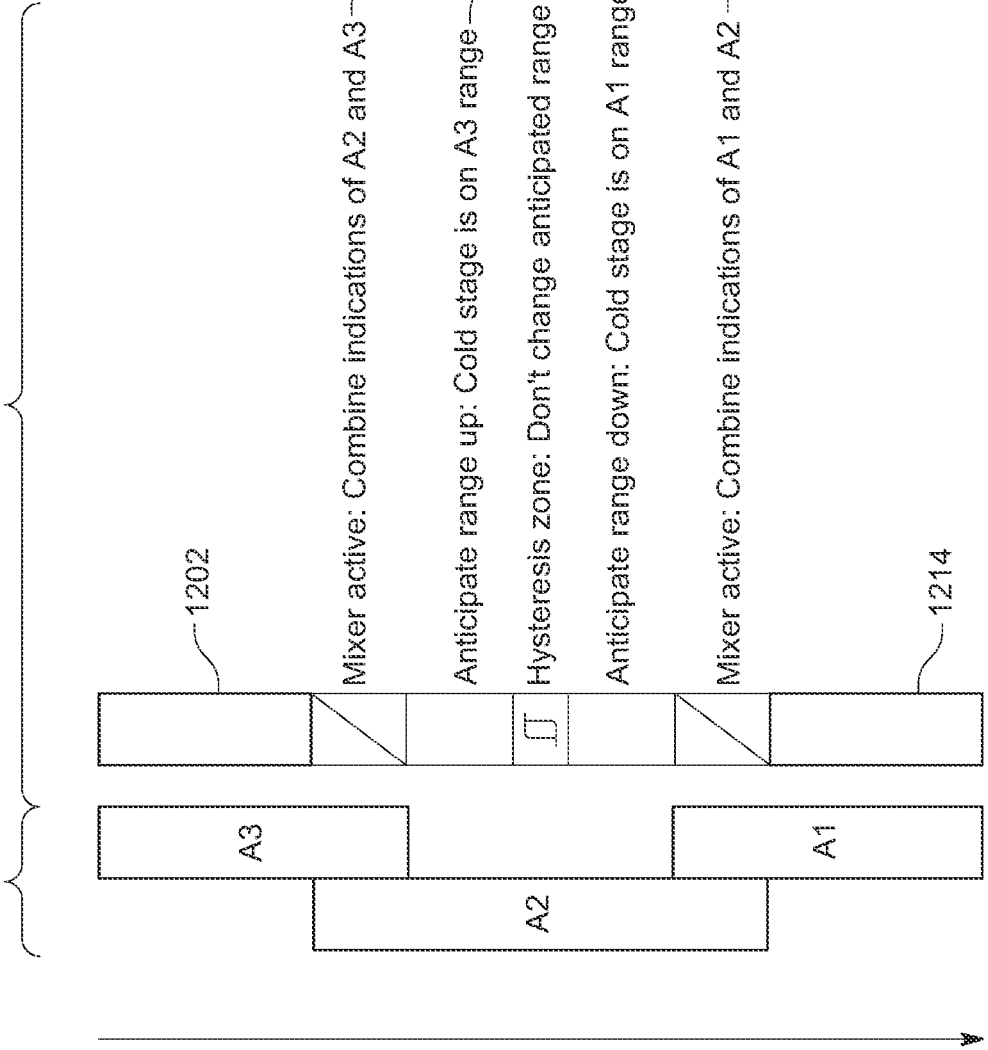
FIG. 12A is a schematic of an exemplary mixing and auto-ranging algorithm 1200 that may be performed by range mixers 410, 510, 710, 1010, and 1110.

FIG. 12A is a schematic of an exemplary mixing and auto-ranging algorithm 1200 that may be performed by range mixers 410, 510, 710, 1010, and 1110. Algorithm 1200 mixes three ranges A1, A2, and A3, as shown in FIG. 12A. For purely illustrative purposes, A1>A2>A3. It should be understood that higher gain is typically associated with a lower range in measured variable, and vice versa. Therefore, an exemplary gain configuration of A1>A2>A3 would most likely correspond to the following measured range configuration: r1<r2<r3. In this situation, the highest gain A1 would apply to the lowest range in measured data r1, etc. FIG. 12A shows the gain increasing from A3 to A1 (top to bottom) as the value of the measured signal decreases. That is, as the measured signal decreases in range from r3 to r1.

When the measured signal is in the highest range (e.g., range r3 in FIG. 6A), algorithm 1200 applies lowest gain A3. As the measured signal decreases and approaches the next lowest range, i.e., the range where next higher gain A2 is desired, the mixer (e.g., 410, 510, 710, 1010, and 1110) becomes active. This occurs at stage 1204. In stage 1204, the mixer combines A3 and A2 to smooth the transition. At 1206, the transition between A3 and A2 ranges is complete. The mixer applies A2 only. At stage 1208, the measured data is solidly in the A2 range. Here any switching between stages or mixing by the mixer is erroneous. Therefore, algorithm 1200 applies a hysteresis that prevents changes in anticipated range. This ensures that there is no erroneous switching of electronics based on noise or aberrations in the data. At step 1210, the measured data decreases further to approach the lowest range in measured value (e.g., r1 in FIG. 6A) where highest gain A1 is most appropriate. Therefore, algorithm 1200 "warms up" the A1 gain profile. Mixer does not actually engage A1 gain with regard to the measured signal at this time. Instead, it is switched on to get rid of any transients that may occur. The mixer starts to actively mix A2 and A1 ranges at step 1212. This is because the measured signal is now close enough to the highest gain A1/lowest measured range r1 to smooth the transition. Finally, at step 1214, the measured data is now solidly in the A1 range. The mixer provides only the A1 gain.

It is to be understood that, although FIG. 12A has been explained in terms of increasing gain from the lowest A3 gain to the highest A1 (decreasing range from highest measured range r3 to lowest measured range r1), FIG. 12A is bi-directional. That is, algorithm 1200 can also proceed where the gain decreases from A1 to A3, corresponding to an increase in the range of measured data from r1 to r3. In that case, algorithm 1200 would follow steps in the reverse order, i.e., 1214-1202.

Figure 12B:
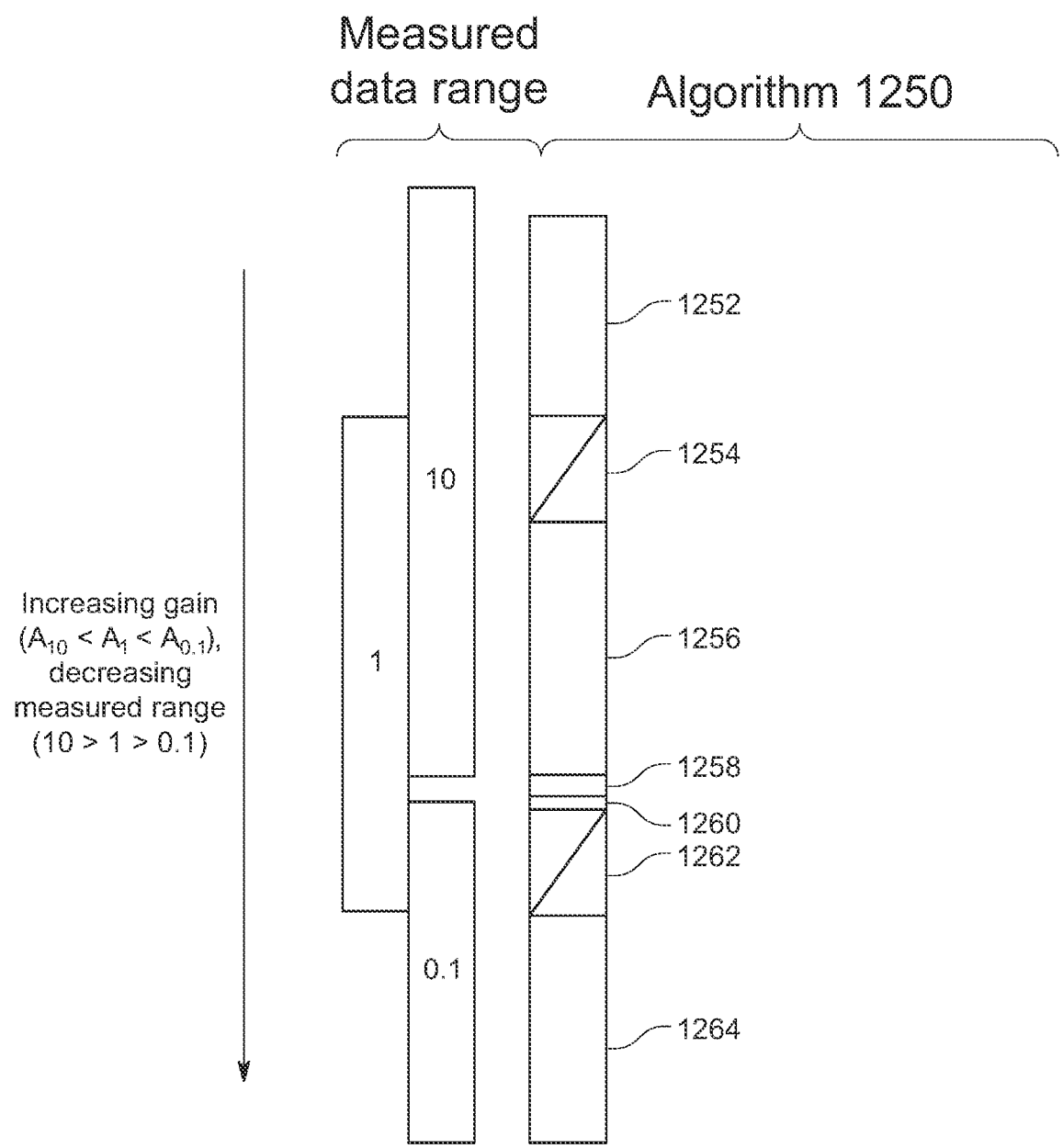
FIG. 12B shows a non-symmetrical auto-ranging algorithm 1250 that may be performed by range mixers 410, 510, 710, 1010, and 1110.

The auto-ranging algorithms can be different for any application and do not need to be symmetrical or linear, as shown in FIG. 12A. A non-symmetrical variation 1250 is shown in FIG. 12B. In FIG. 12B, there are three ranges specified by the order of magnitude of the measured data: 10, 1, and 0.1. Note that the numbers 10, 1, and 0.1 refer to orders of magnitude of ranges in the measured variable (e.g., voltage). This is unlike FIG. 12A where the ranges are referred to by their gains A1, A2, and A3. Since gain is inversely related to the measured variable, the lowest measured range 0.1 corresponds to the highest gain ($A_{0.1}$). The highest measured range 10 corresponds to the lowest gain ($A_{10}$). Because the change between the 10 and 0.1 ranges represents a change of two orders of magnitude is measured data, extra care needs to be taken in range mixing. The measured signal is so small in the 0.1 range, in particular, that it may be easily overwhelmed by range mixing. Therefore, algorithm 1250 applies range mixing with caution.

When the measured signal is in the highest measured data range 10, algorithm 1250 applies lowest gain ($A_{10}$) appropriate for that range. This is stage 1252 in FIG. 12B. As the measured signal decreases and approaches the next highest measured data range, 1, the mixer becomes active. This occurs at stage 1254. In stage 1254, the mixer combines gain for the 10 ($A_{10}$) and 1 ($A_1$) ranges to smooth the transition. At 1256, the transition between 10 and 1 ranges is complete. The mixer applies the gain for 1 ($A_1$) only. However, since the difference in ranges between 1 and 10 ranges is so large, the electronics for the 10 ($A_{10}$) measured data range is kept warm. Although there is no mixing, the mixer is ready to switch between ranges as needed to prevent saturation. At stage 1258, the measured data so solidly in the 1 range that switching to range 10 is not possible. Here any switching between stages or mixing by the mixer is erroneous. Therefore, algorithm 1250 applies a hysteresis that prevents changes in anticipated range. This makes sure there is no erroneous switching of electronics based on noise or aberrations in the data. At step 1260, the measured data decreases sufficient to approach the lowest 0.1 measured data range. In this step the mixer anticipates a range change downward by engaging the electronics for the 0.1 range, but keeping them offline (i.e., not mixing ranges). As the measured data continues to decrease toward the 0.1 range, algorithm 1260 enters step 1262. In this stage, the mixer actively combines the gains for the 0.1 ($A_{0.1}$) and 1 ($A_1$) ranges to smooth transition to the 0.1 range. Finally, at step 1264, the measured data is now solidly in the 0.1 range. The mixer provides only the gain ($A_{0.1}$) associated with the lowest 0.1 measured data range.

It is to be understood that, although FIG. 12B has been explained in terms of decreasing measured range (increasing gain) from the highest 10 range to the lowest 0.1 measured data range, FIG. 12B is bi-directional. That is, algorithm 1250 can also proceed where the measured data is increasing from range 0.1 to 10, and the corresponding gain is decreasing. In that case, algorithm 1260 would follow steps in the reverse order, i.e., 1264-1252.

Figure 13A:
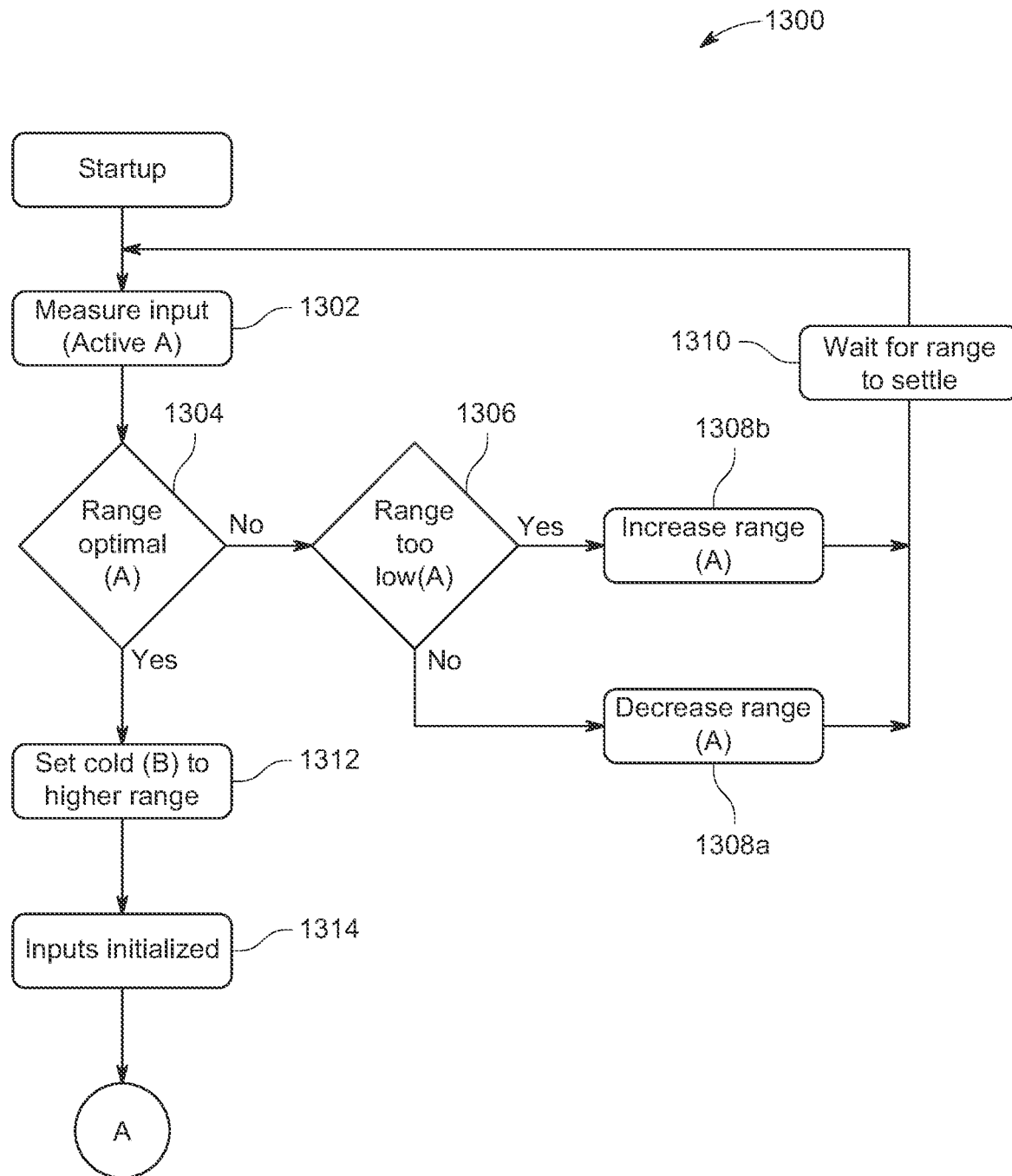
FIG. 13A shows a flowchart 1300 representing a range change anticipation algorithm 1300 that may be performed by range mixers 410, 510, 710, 1010, and 1110 in implementing algorithms disclosed herein (e.g., 600, 620, 910, 1200, and 1250) disclosed herein.
Figure 13B:
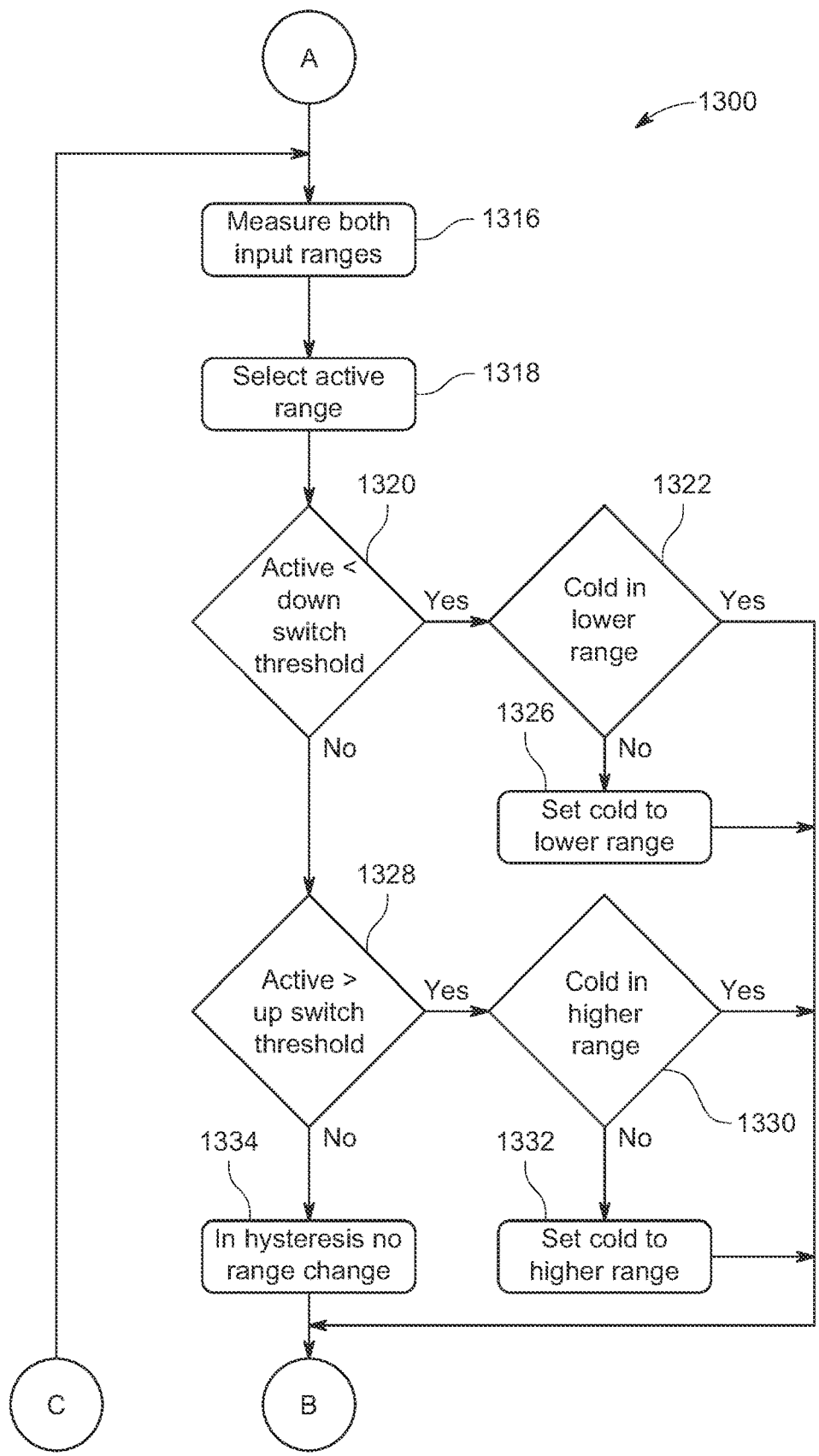
FIG. 13B show another part of flowchart 1300.
Figure 13C:
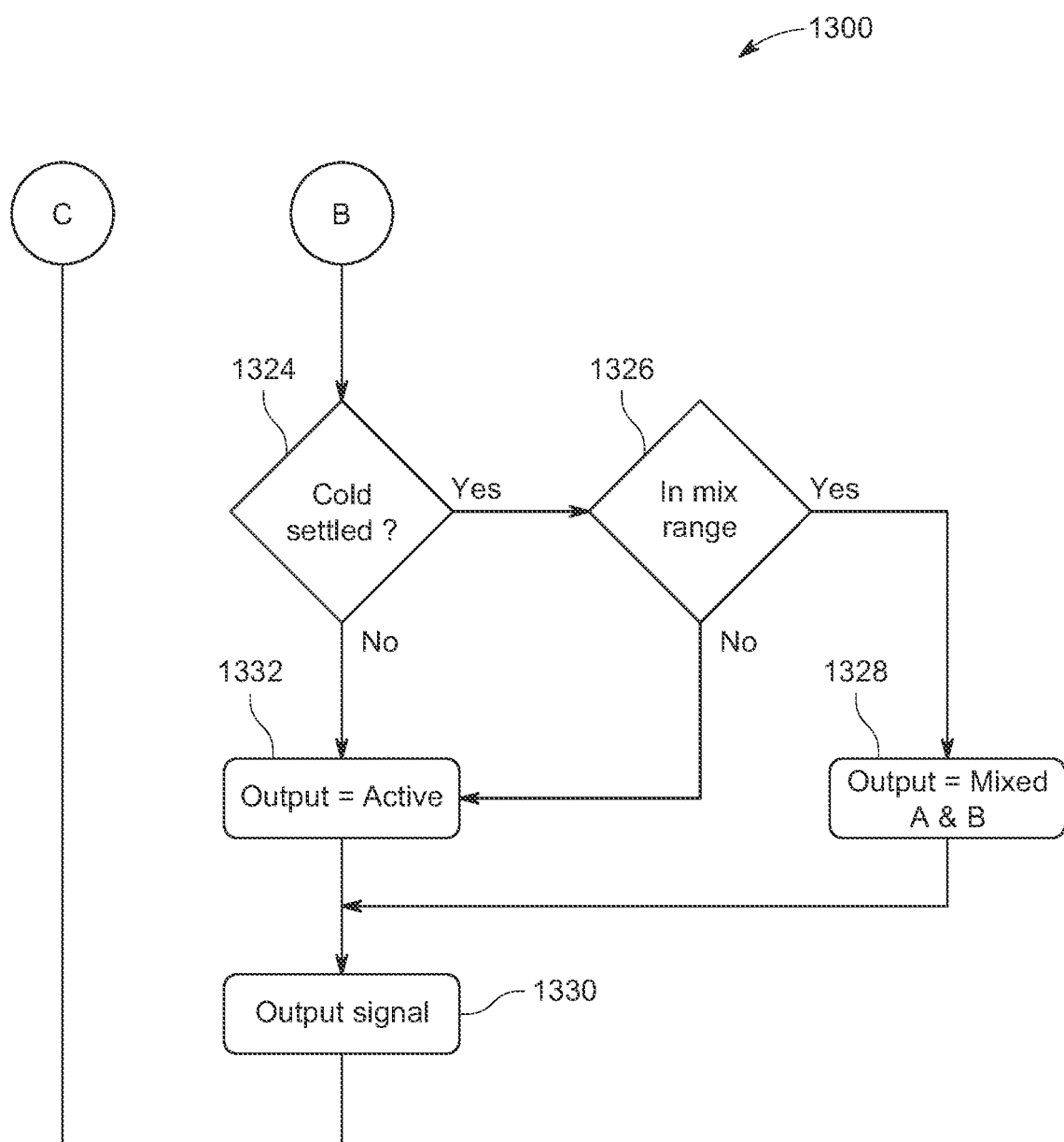
FIG. 13C show another part of flowchart 1300.

FIGS. 13A and 13B show a flowchart representing a range change anticipation algorithm 1300 that may be performed by a mixer in implementing algorithms disclosed herein (e.g., 600, 620, 910, 1200, and 1250).

Algorithm 1300 begins by initializing the input signals. At step 1302, the input signal is measured. A first range A is made active for comparison with the input signal at step 1302. That comparison is made at step 1304.

If range A is not desired, algorithm 1300 determines whether range is too low or high in step 1306. If the range is too high, the range is decreased at step 1308a. If range A is too low for the measured input signal, the gain for range A is increased at step 1308b. Whether range A is increased or decreased, the next step 1310 waits for any transient effects caused by the gain change to dissipate. Subsequent to transient dissipation, algorithm 1300 performs step 1302 again to measure the signal and compare with modified gain for range A.

When step 1304 determines that the gain associated with range A is desired for the measured signal, algorithm 1300 proceeds to step 1312. At step 1312, the algorithm anticipates a change from range A to a new range B. It "warms up" the electronics associated with new range B. At step 1314, algorithm 1300 initiates inputs based on its assessment of new range B and the measured input. At step 1316, algorithm 1300 measures the input in both ranges A and B. At step 1318, algorithm 1300 selects the best range for the measured input among ranges A and B for being active (i.e., for use in the measuring the input).

Algorithm 1300 then begins the process of deciding a switching threshold based on the measured input and current ranges A and B. In step 1320, algorithm 1300 determines if the active range is less than a down range switching threshold. If the active range is less than the down range threshold, algorithm 1300 performs step 1322 to determine if the cold or unused range among ranges A and B is in the lower range. If the cold range A or B is in the lower range, algorithm 1300 proceeds to step 1324 to initiate mixing. If the cold range A is not the lower range, the algorithm 1300 sets the cold range to the lower range in step 1326, then proceeds to step 1324 to initiate mixing.

If the algorithm 1300 determines that the active range is not less than a down switch threshold in step 1320, it proceeds to step 1328. At step 1328, the algorithm 1300 determines whether or not the active range is greater than an up switch threshold. If so, the algorithm 1300 proceeds to step 1330 to determine if the cold or unused range among ranges A and B is the higher range. If the cold range A or B is in the higher range, algorithm 1300 proceeds to step 1324 to initiate mixing. If the cold range A is not the higher range, the algorithm 1300 sets the cold range to the higher range in step 1332, then proceeds to step 1324 to initiate mixing.

If the algorithm 1300 finds that the active range is not less than a down switch threshold (step 1320) and finds it is also not greater than the up switch threshold (step 1328), the algorithm proceeds to step 1334. At step 1334, the algorithm 1300 applies a hysteresis to prevent range changing. This is because the measured signal is not within the range changing up or down thresholds. Therefore, any decision to change ranges would be based on erroneous noise or glitches in the data. Once hysteresis is applied, the algorithm proceeds to step 1324 to initiate mixing.

At step 1324, the algorithm 1300 begins steps to initiate mixing. The first step is to make sure the cold range is settled. If the cold range is settled, the system is ready for mixing. Then algorithm 1300 proceeds to step 1326 to determine whether or not to mix in ranges. If the decision is made to mix, algorithm 1300 mixes the ranges at step 1328 and then provides the mixed signal as output at step 1330. If the decision is not to mix, the algorithm sets the output to the active range at step 1332. If the cold range is not settled, the algorithm 1300 proceeds from step 1324 to step 1332 to set the output to the active range. After the output is set to the active range at 1332, then the signal is output at step 1330.

Ranging does not need to be accomplished exclusively by algorithm. It can also be accomplished via hardware. FIG. 14 shows parameters input one such exemplary hardware variation 1400. In 1400, there is a "main" channel capable of measuring the named range, and an "aux" channel with less gain. At each ranging update, the percentage of full-scale indication on the main channel can be used to determine behavior as follows:

TABLE 1

Parameters of mechanical ranging algorithm 1400.

| % of Main Channel | Next Range | Interpolator State |
|---|---|---|
| >120% | Range up if it exists | All aux |
| 100%-120% | No change | All aux |
| 70%-100% | No change | Active, scaled based on % of main |
| 10%-70% | No change | All main |
| <10% | Range down if it exists | All main |

FIG. 14 shows how range mixing algorithm 1400 will behave for different input levels. More particularly, FIG. 14 shows how algorithm 1400 will mix (i.e. "Mixing") different channel gains A and B based on the inputs (i.e., Range, Range Enumeration, Input Voltage, Enable Preamp, Enable Stage B, Enable Stage C, Channel A Gain, and Channel B Gain). The inputs are for two gain channels A and B and two sample stages B and C. "Range Enumeration" is an integer representation of a particular range (i.e., 10 V range is "0," 1 V range is "1," 100 mV range is "2," etc.).

Figure 15:
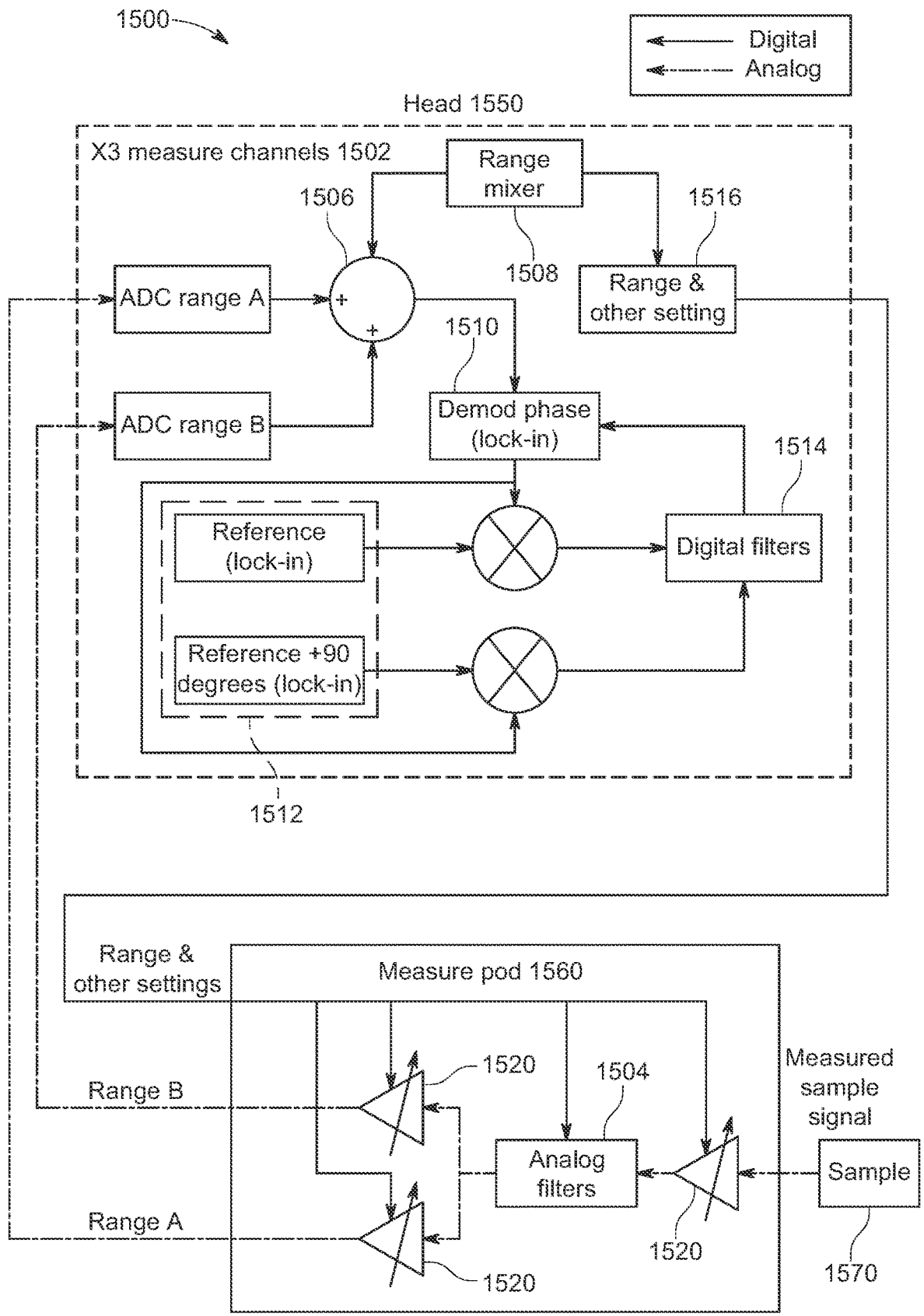
FIG. 15 illustrates a measurement signal chain 1500 between an exemplary head unit 1550 and exemplary measurement pod 1560 that may use variations 400, 500, 700, 800, 1000, 1100 and algorithms 600, 620, 910, 1200, 1250, 1300, and 1400.

FIG. 15 illustrates a measurement signal chain 1500 between an exemplary head unit 1550 and exemplary measurement pod 1560 that may use variations 400, 500, 700, 800, 1000, 1100 and algorithms 600, 620, 910, 1200, 1250, 1300, and 1400. Although FIG. 15 shows particular aspects of seamless ranging in system 1500, it should be understood that system 1500 can accommodate any variation disclosed herein. Both source pods 1560 and head units 1550 of system 1500 are described in more detail in U.S. patent application Ser. No. 17/241,472, to Fortney, "INTEGRATED MEASUREMENT SYSTEMS AND METHODS FOR SYNCHRONOUS, ACCURATE MATERIALS PROPERTY MEASUREMENT."

As shown in FIG. 15, the head 1550 includes measure channels 1502. In the exemplary case there are two input measure channels, one for a Range A and one for a Range B, each with its associated ADC. Note that, in some variations, each measurement unit 1560 will have an associated configuration 1500 in communication with head 1550. This means that a variation with three measurement pods 1560 may have six ADCs. It is to be understood than any suitable number of measurement channels is possible, depending on the particular measurement and the number of ranges involved, which may be substantially greater than two (e.g., three, four, or more). The measurement channels 1502 may be obtained from measurement pod 1560 via a number of variable amplifiers 1520 and analog filters 1504, as shown in FIG. 15. Gain on the amplifiers 1520 may be set as described in the context of gains 1520a-1520c in FIGS. 10-12. Channels 1502 may be combined 1506 with a range mixing signal 1508 and sent to for demodulation 1510 via lock-in. Demodulation may be informed by reference signals (e.g., Reference (lock-in) and Reference +90 degrees (lock-in) 1512) and subject to Digital filters 1514 for signal refinement.

The signal can be processed in any number of ways including DC, AC, or Lock In processing. Range decisions can be made on the basis of the peak values of the Measured sample signal regardless of what other processing is being performed for the sake of the measurement. This is because the peak values are what would cause amplifier overload. As shown in FIG. 15, range mixer 1508 may further provide output for Ranges and settings 1516 ultimately fed back to amplifiers 1520 and analog filters 1504 to adjust gain and processing of the Measured sample signal, specifically with respect to each of Ranges A and B. Range mixer 1508 may perform as described above in the context of range mixers 410, 510, 710, 1010, and 1110. This process is referred to as continuous measurement ranging and/or range mixing. Its purpose is to insure against glitches or measurement inconsistencies that might otherwise occur when the measure pod 1560 must change its acquisition parameters to adjust for a change in range of the Measured sample signal.

Measurement pod 1560 may further include digital (non-analog) circuitry capable of performing various functions, including analysis, communication of data, command information, power regulation, timing, and communication with external devices. In variations, measurement pod 1560 has the capability to de-activate this non-analog circuitry while performing a measurement or providing a source signal. Doing so decreases the amount of interference and noise in the signal or measurement. For the same reason, digital signals in the measurement pod 1560 may be isolated from the source pod 1560 and the head 1550.

Figure 16:
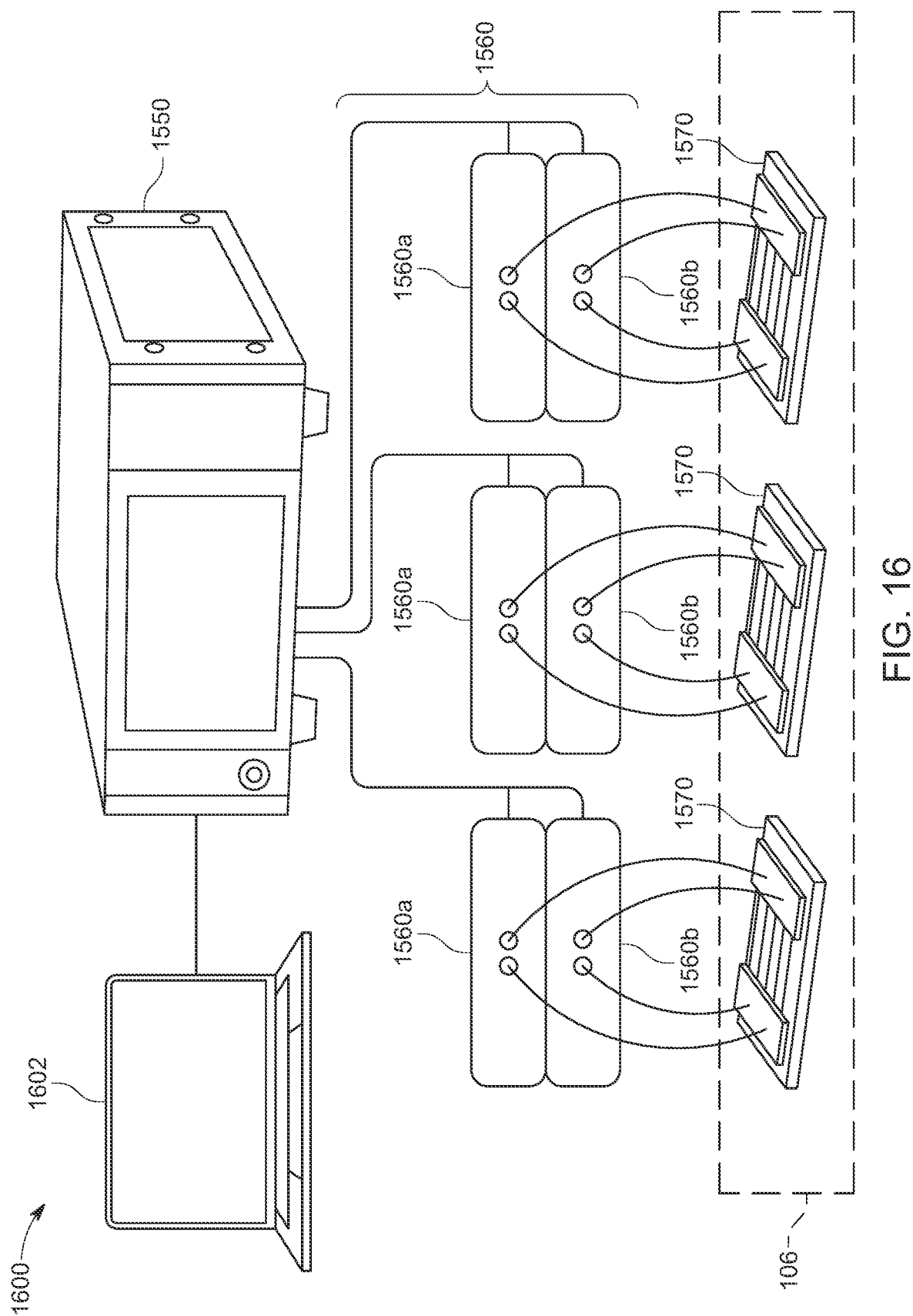
FIG. 16 shows another exemplary variation 1600, where a head unit 1550 can have six channels that can support three measure type pods 1560a and three source type pods 1560b according to aspects of the present disclosure.

Other variations of system 1500 include any suitable number of heads 1550, source pods and measure pods 1560. For example, FIG. 16 shows another exemplary variation 1600, where a head unit 1550 can have six channels that can support three measure type pods 1560a and three source type pods 1560b. In this variation, the head 1550 is also shown connected to an optional computer 1602 and three exemplary sampled or devices under test (DUTs) 1570. Again, this configuration is merely exemplary. There is no requirement for equal numbers of measure 1950*a* and source 1950*b* pods. One source 1950*a* could provide the excitation signal for all three DUTs 1570, for example.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein.

Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value are intended to include both the specified value and values within 10% of the specified value, unless expressly stated otherwise. Further, it is to be understood that the drawings accompanying the present application may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

I claim:

1. A measurement system comprising:
   a gain chain configured to amplify an analog input signal;
   a range selector configured to select a gain between the analog input signal and a plurality of analog-to-digital converter (ADC) outputs from a plurality of ADCs, wherein each ADC output has a path, and a gain of each output path is made up of a plurality of gain stages in the gain chain; and
   a mixer configured to combine the plurality of ADC outputs into a single mixed output, and wherein:
      the plurality of ADCs comprises a first ADC and a second ADC; and
      the combining the plurality of ADC outputs is performed in accordance to:
         mixed output=$\alpha E_{first}+(1-\alpha)E_{second}$
         where:
            $E_{first}$ is the output of the first ADC;
            $E_{second}$ is the output of the second ADC; and
            $\alpha$ is a mixing parameter that varies from one to zero.

2. The system of claim 1 comprising three or more ADCs.

3. The system of claim 1, wherein at least one of:
   a first portion of the gain chain is connected to a first one of the plurality of ADCs and a second portion of the gain chain is connected to a second one of the plurality of ADCs; and
   the plurality of ADCs comprises at least two types of ADCs.

4. The system of claim 3, wherein the range selector selects a gain for the first one of the plurality of ADCs from the first portion of the gain chain and selects a gain for the second one of the plurality of ADCs from the second portion of the gain chain.

5. The system of claim 1, wherein each of the gain stages in the gain chain is connected to each of the plurality of ADCs via one or more switch banks.

6. The system of claim 5, wherein the range selector selects a first portion of the shared gain stages for a first one of the plurality of ADCs and a second portion of the shared gain stages for a second one of the plurality of ADCs by setting switches in the one or more switch banks.

7. The system of claim 5, wherein the range selector comprises a first and second multiplexer and,
   wherein the first multiplexer selects the first portion of the shared gain stages; and the second multiplexer selects the second portion of the shared gain stages.

8. The system of claim 7, wherein selection of the first portion of the shared gain stages comprises configuring a gain for the first one of the plurality of ADCs and selection of the second portion of the shared gain stages comprises configuring a gain for the second one of the plurality of ADCs.

9. The system of claim 8, wherein the configuring a gain for the first and second one of the plurality of ADCs comprises configuring the gains according to at least one range of the input signal.

10. The system of claim 1, wherein:
    the gain of each output path is substantially the same; and
    the mixer averages the outputs from each path to reduce noise in the single output.

11. A measurement system comprising:
    a gain chain configured to amplify an analog input signal;
    a range selector configured to select a gain between the analog input signal and a plurality of analog-to-digital converter (ADC) outputs from a plurality of ADCs, wherein each ADC output has a path, and a gain of each output path is made up of a plurality of gain stages in the gain chain; and
    a mixer configured to:
       when the input signal is in a first range, select an output from a first ADC as a single mixed output;
       when the input signal is in a second range, select an output from a second ADC as the single mixed output; and when the input signal is in between the first and second ranges, select a mix of the outputs from the first and second ADCs as the single mixed output.

12. The system of claim 11, wherein the system:
maintains the second ADC online during a first transition period when the input signal is in the first range; and
maintains the first ADC online during a second period when the input signal is in the second range.

13. The system of claim 12, wherein the range selector is configured to configure a gain for at least one of the first ADC and second ADC based on an anticipated range of the input signal.

14. The system of claim 12, wherein, during a hysteresis period, the system:
maintains the first ADC offline;
maintains the second ADC online; and
maintains a gain of the second ADC constant.

15. The system of claim 14, wherein the hysteresis period is between the first transition period and the second transition period.

16. A measurement system comprising:
a gain chain configured to amplify an analog input signal;
a range selector configured to select a gain between the analog input signal and a plurality of analog-to-digital converter (ADC) outputs from a plurality of ADCs, wherein each ADC output has a path, and a gain of each output path is made up of a plurality of gain stages in the gain chain; and
a mixer configured to combine the plurality of ADC outputs into a single mixed output, wherein the plurality of ADC output paths comprises:
two ADC output paths that can independently be configured into a high range and a low range path;
the low range path having a first gain for converting the analog input signal;
the high range path having a second gain for converting the analog input signal, the second gain being lower than the first gain;
a mixing device configured to combine an output of the lower range with an output of the higher range; and
a device configured to vary an amount of gain combined from the low range path and the high range path.

17. The system of claim 16, wherein the high range path is connected to a first gain chain and the low range path is connected to a second gain chain.

18. The system of claim 16, further comprising a selector to select gain stages of the first gain chain for the first gain and to select gain stages of the second gain chain for the second gain.

19. The system of claim 16, wherein each of the first and second gains comprises gain stages in a gain chain common to the low range path and the high range path.

20. A method comprising:
amplifying an analog input signal using a gain chain;
selecting a gain between the analog input signal and a plurality of analog-to-digital converter (ADC) outputs from a plurality of ADCs, wherein each ADC output has a path, and a gain of each output path is made up of gain stages in the gain chain; and
combining the plurality of ADC outputs into a single mixed output,
wherein each of the gain stages in the gain chain is connected to each of the plurality of ADCs via one or more switch banks.

21. The method of claim 20, wherein a first portion of the gain chain is connected to a first one of the plurality of ADCs and a second portion of the gain chain is connected to a second one of the plurality of ADCs.

22. The method of claim 20 further comprising:
configuring two ADC output paths independently into a high range and a low range path;
applying a first gain from the low range path to convert the analog input signal;
applying a second gain from the high range path to convert the analog input signal, the second gain being lower than the first gain;
combining an output of the lower range with an output of the higher range; and
varying an amount of gain combined from the high range path and the low range path.

* * * * *